(12) United States Patent  
Miyashita

(10) Patent No.: US 7,110,740 B2  
(45) Date of Patent: Sep. 19, 2006

(54) MIXER CIRCUIT, RECEIVER CIRCUIT, AND FREQUENCY COMPARISON CIRCUIT

(75) Inventor: Takumi Miyashita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 389 days.

(21) Appl. No.: 10/274,372

(22) Filed: Oct. 21, 2002

(65) Prior Publication Data

US 2003/0094976 A1 May 22, 2003

(30) Foreign Application Priority Data

Oct. 22, 2001 (JP) ............... 2001-323843
May 30, 2002 (JP) ............... 2002-158275

(51) Int. Cl.
  *H03D 13/00* (2006.01)
(52) U.S. Cl. ................. 455/326; 455/333
(58) Field of Classification Search ........... 455/323, 455/326, 333; 327/2, 39
  See application file for complete search history.

(56) References Cited

U.S. PATENT DOCUMENTS

| | | | | |
|---|---|---|---|---|
| 4,499,602 A | * | 2/1985 | Hermeling et al. | 455/180.3 |
| 4,977,617 A | * | 12/1990 | Sharma et al. | 455/319 |
| 6,255,889 B1 | * | 7/2001 | Branson | 327/359 |
| 6,329,864 B1 | * | 12/2001 | Suematsu et al. | 327/356 |
| 6,560,293 B1 | * | 5/2003 | Alelyunas et al. | 375/261 |
| 6,587,678 B1 | * | 7/2003 | Molnar et al. | 455/323 |
| 6,654,595 B1 | * | 11/2003 | Dexter | 455/323 |
| 6,711,396 B1 | * | 3/2004 | Bergsma et al. | 455/317 |
| 6,785,530 B1 | * | 8/2004 | Hatcher et al. | 455/326 |
| 2003/0020514 A1 | * | 1/2003 | Takeo et al. | 327/3 |

* cited by examiner

*Primary Examiner*—Nguyen T. Vo
*Assistant Examiner*—Adeel Haroon
(74) *Attorney, Agent, or Firm*—Arent Fox PLLC

(57) ABSTRACT

A mixer circuit contains a first terminal and a second terminal to which a first differential input signal is applied, and an active element switching a short-circuit between the first terminal and the second terminal. By driving the active element by a second differential input signal having a predetermined frequency, the first terminal and the second terminal are intermittently short-circuited at twice the frequency of a predetermined frequency.

10 Claims, 25 Drawing Sheets is qxs

MIXER CIRCUIT, RECEIVER CIRCUIT, AND FREQUENCY COMPARISON CIRCUIT

BACKGROUND OF THE INVENTION

1. Field of the Invention

The present invention generally relates to mixer circuits and communication apparatuses employing a mixer circuit, and more particularly to a direct demodulation circuit and a communication apparatus employing a direct demodulation circuit.

2. Description of the Related Art

Regarding a communication system having a low-frequency component in a baseband of a broadband such as WCDMA (Wideband Code Division Multiplex Access), it has recently become desirable to use a direct demodulation circuit without any external filter part so as to realize miniaturization, low cost and low electric power consumption with respect to a receiver. A direct demodulation circuit has the problem that a weak local current mixed into an RF signal is detected together with the RF signal and there arises a DC offset.

It is possible to reasonably construct a small subharmonic pumping mixer employing an APDP (anti-parallel diode pair) in which diodes are connected in anti-parallel. Also, when the frequency of the local current is set as half of a carrier frequency, it is possible to perform direct demodulation. At the same time, even if the local current with half of the carrier frequency leaks an RF signal, it is impossible for the local current to return and become a DC component. As mentioned above, the subharmonic pumping mixer has the advantage that the DC offset is not generated in principal. Thus, the subharmonic mixer can be used as a direct demodulation mixer.

FIG. 1 shows a structure of a subharmonic pumping mixer.

An RF is supplied to an APDP 10 formed with diodes D1 and D2 via a filter formed with an L1 and a C1. In a down-conversion mixer, a local Lo is additionally supplied to the APDP via a filter formed with an L2 and a C2. When the APDP demodulates the RF, the demodulated signal is supplied to a terminal of a resistor R via a low-pass filter formed with an L3 and a C3.

Figure 1:
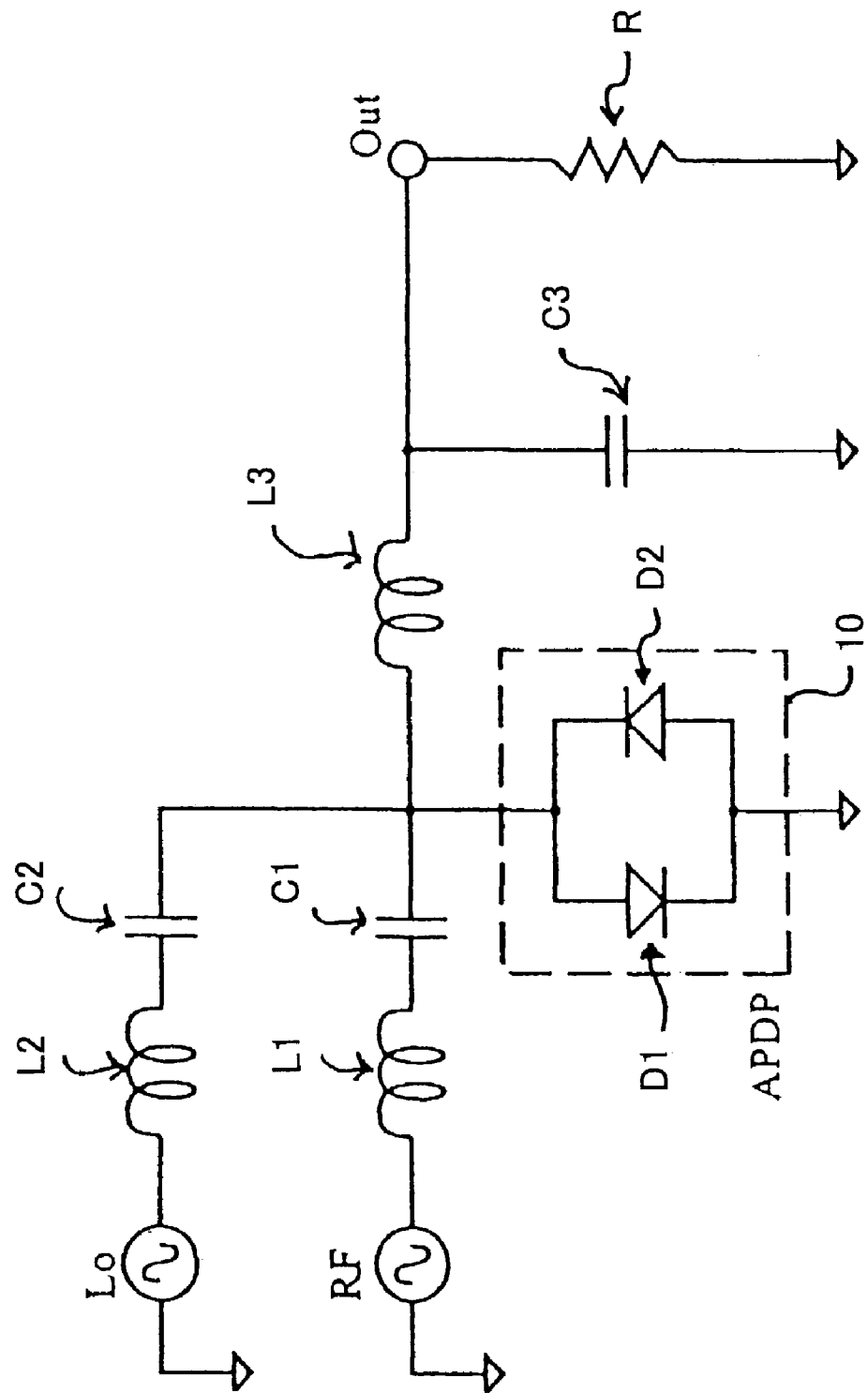

As mentioned above, while a conventional subharmonic pumping mixer has the advantage that it is possible to implement the subharmonic pumping mixer with low cost and no DC offset arising due to a leak of a local signal, the subharmonic pumping mixer has some problems with respect to the gain and the noise characteristics.

Therefore, it is necessary to develop a small size, low cost and a low electric power consuming mixer circuit capable of suppressing any DC offset caused by a local leak signal and achieving better gain and noise characteristics.

SUMMARY OF THE INVENTION

It is a general object of the present invention to provide a mixer circuit and others in which at least one problem caused by the above limits and disadvantages of the related art are virtually eliminated.

A mixer circuit according to the present invention comprises: a first terminal and a second terminal to which a first differential input signal is applied; and an active element switching a short-circuit between the first terminal and the second terminal, wherein by driving the active element by a second differential input signal having a predetermined frequency, the first terminal and the second terminal are intermittently short-circuited at a predetermined multiple frequency of the predetermined frequency (for example, twice the predetermined frequency).

For example, the active element is a MOS transistor. Also, the active element is formed with two active elements connected in parallel between the first terminal and the second terminal, which are driven with a reversed phase signal of the second differential input signal.

The above mixer circuit can be realized at a small size, a low cost and with low electric power consumption. Additionally, since a signal having half of a frequency to be detected (carrier frequency) is used as a local signal, it is possible to prevent a DC offset caused by a local leak signal and achieve good gain and noise characteristics because the signal path is always maintained at less than a predetermined impedance.

Additionally, a receiver circuit according to the present invention comprises: a phase comparison circuit containing an active element switching a short-circuit between two terminals to which a first differential input signal is applied, the phase comparison circuit, by driving the active element by a second differential input signal having a predetermined frequency, intermittently switching on a short-circuit between the terminals at a predetermined multiple frequency of the predetermined frequency; a feedback circuit generating the first differential input signal based upon a signal arising between the terminals; and a latch circuit latching the second differential input signal in sync with the first differential input signal.

According to the above-mentioned receiver circuit, since the mixer circuit according to the present invention is used as a phase comparison circuit, it is possible to implement a phase comparison circuit achieving small size, low noise and high speed.

Additionally, a frequency comparison circuit according to the present invention comprises: a first phase comparison circuit containing a first active element switching a short-circuit between two terminals to which a first differential input signal is applied, the phase comparison circuit, by driving said first active element by a second differential input signal having a predetermined frequency, intermittently switching on a short-circuit between said terminals at a predetermined multiple frequency of said predetermined frequency; a second phase comparison circuit containing a second active element switching a short-circuit between two terminals to which a third differential input signal is applied, the phase comparison circuit, by driving said second active element by said second differential input signal having a predetermined frequency, intermittently switching on a short-circuit between said terminals at a predetermined multiple frequency of said predetermined frequency; and a multiplier multiplying a phase comparison result of said first phase comparison circuit and a phase comparison result of said second phase comparison circuit.

According to the above frequency comparison circuit, when the mixer circuit according to the present invention is used as a phase comparison circuit, it is possible to implement a frequency comparison circuit with a small size and low electric power consumption.

BREIF DESCRIPTION OF THE DRAWINGS

Figure 2:
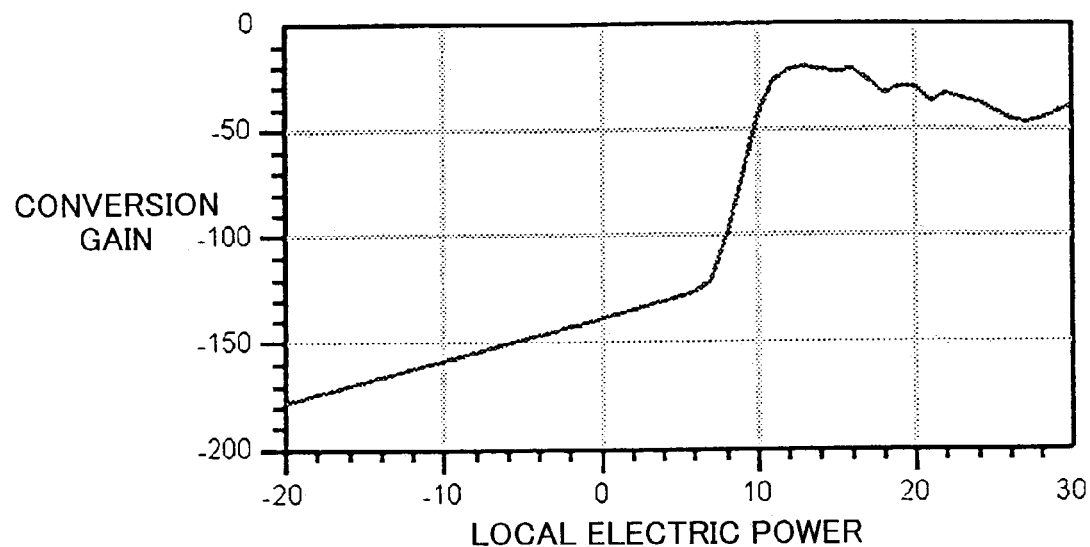
FIG. 2 shows a characteristic of the subharmonic pumping mixer in FIG. 1 with respect to a conversion gain. As is shown in FIG. 2, the conversion gain has a maximum of no more than about −20 DB within a range in which local power is increased.
Figure 3:
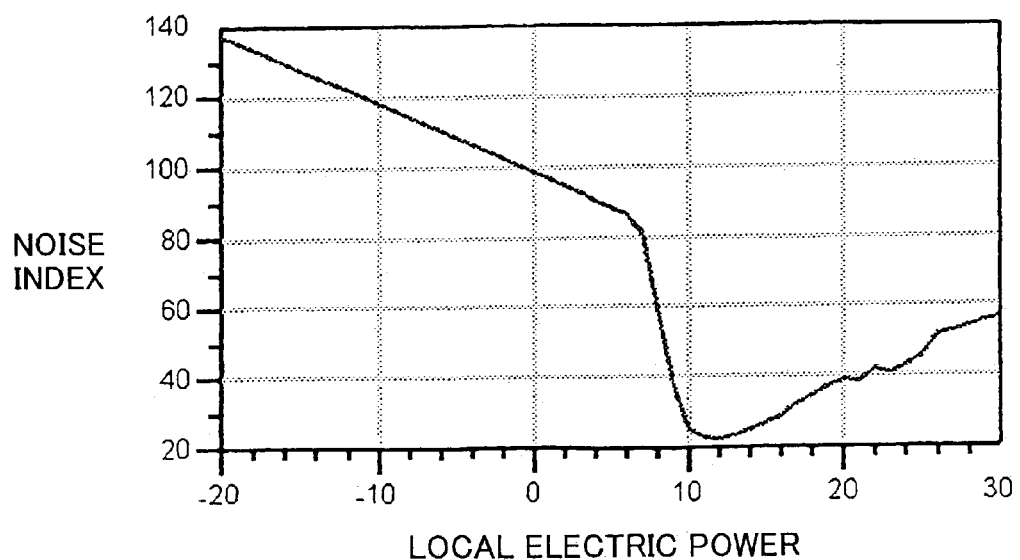
FIG. 3 shows a characteristic of the subharmonic pumping mixer in FIG. 1 with respect to a noise index. As is shown in FIG. 3, the noise index has a minimum of no less than about 20 DB.
Figure 4:
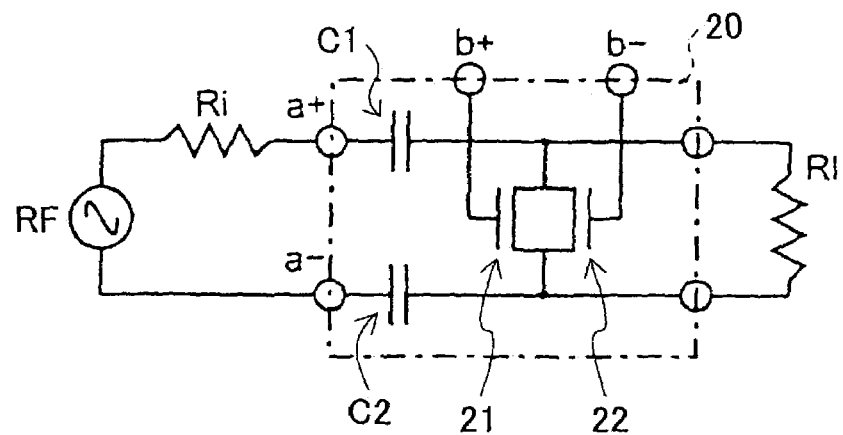
Figure 5:
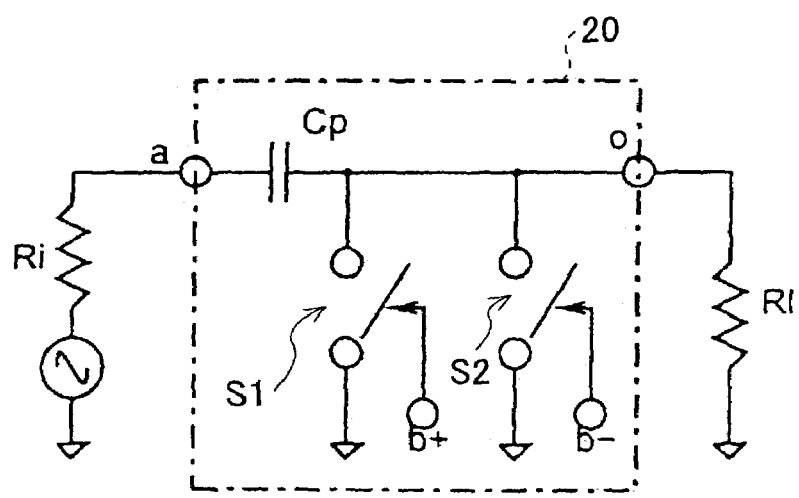
Figure 6:
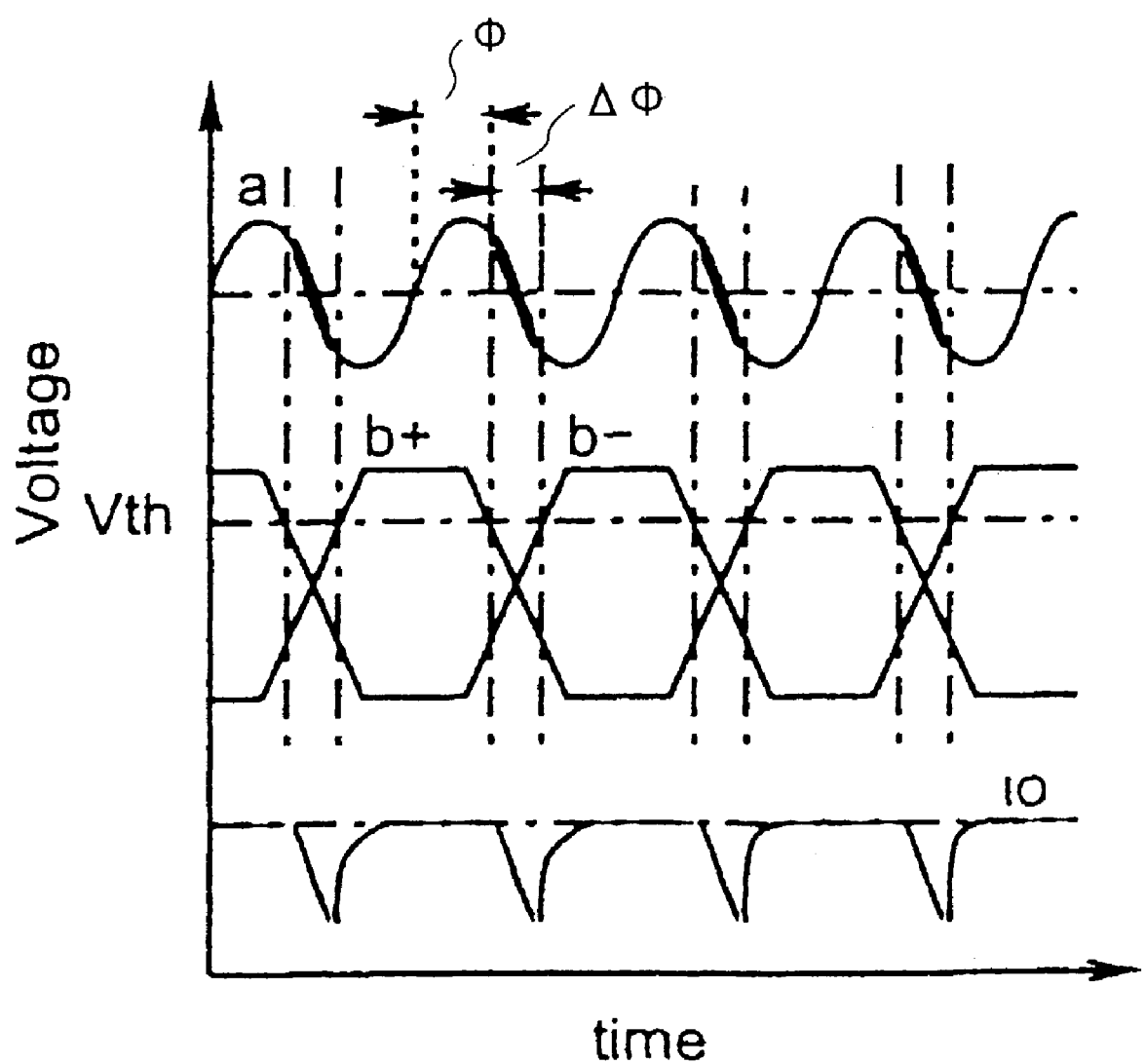
Figure 7:
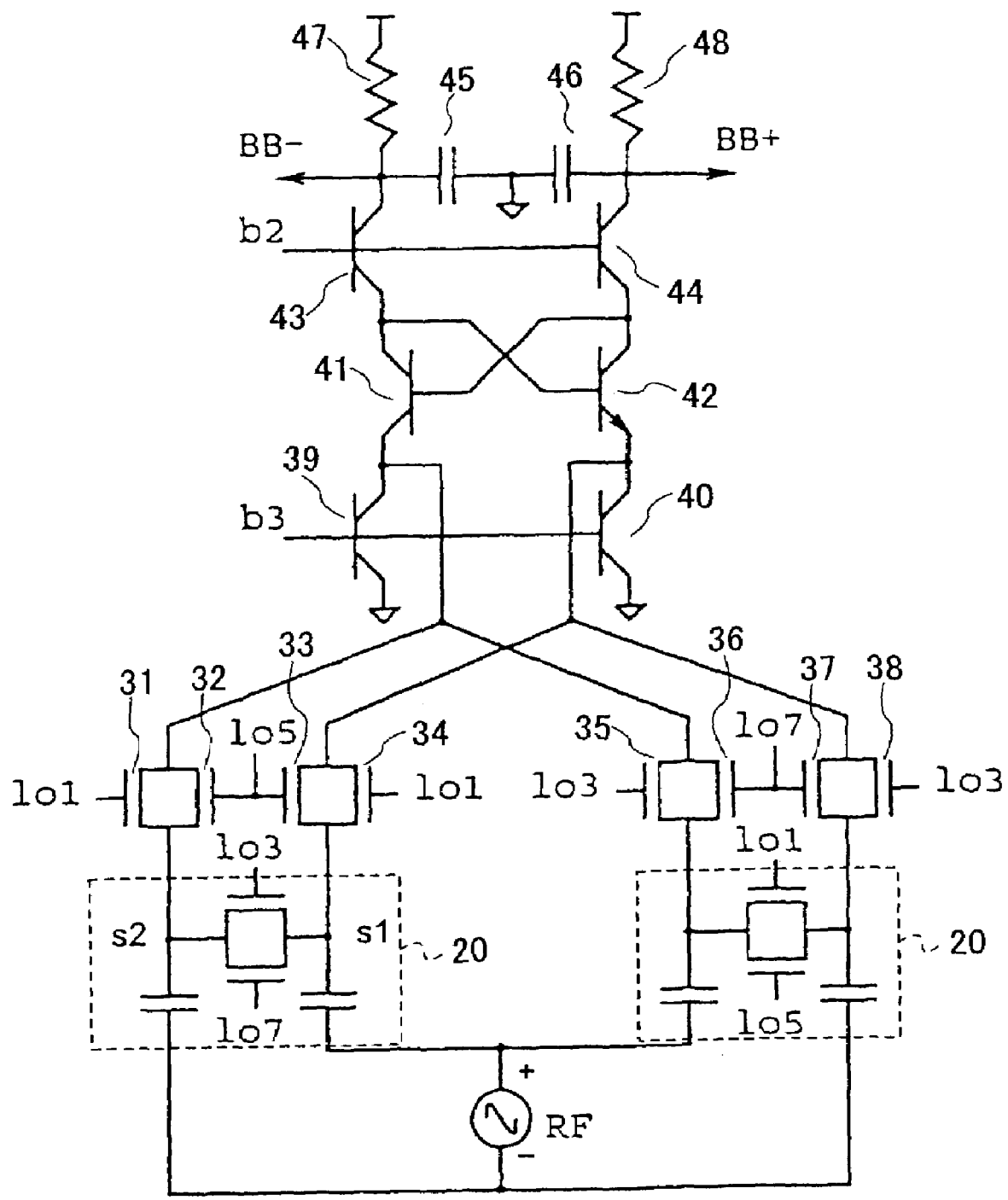
Figure 8:
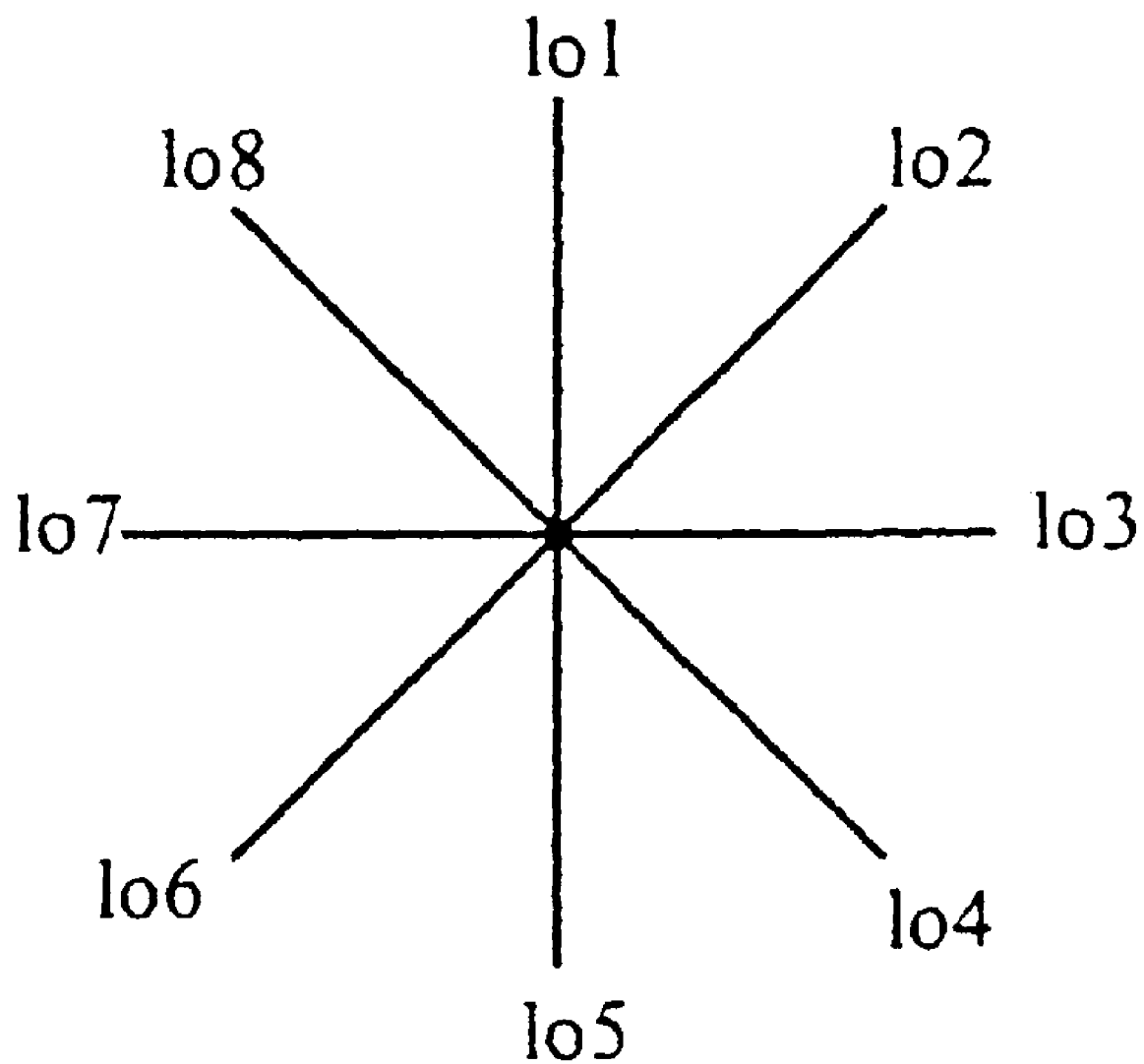
Figure 9:
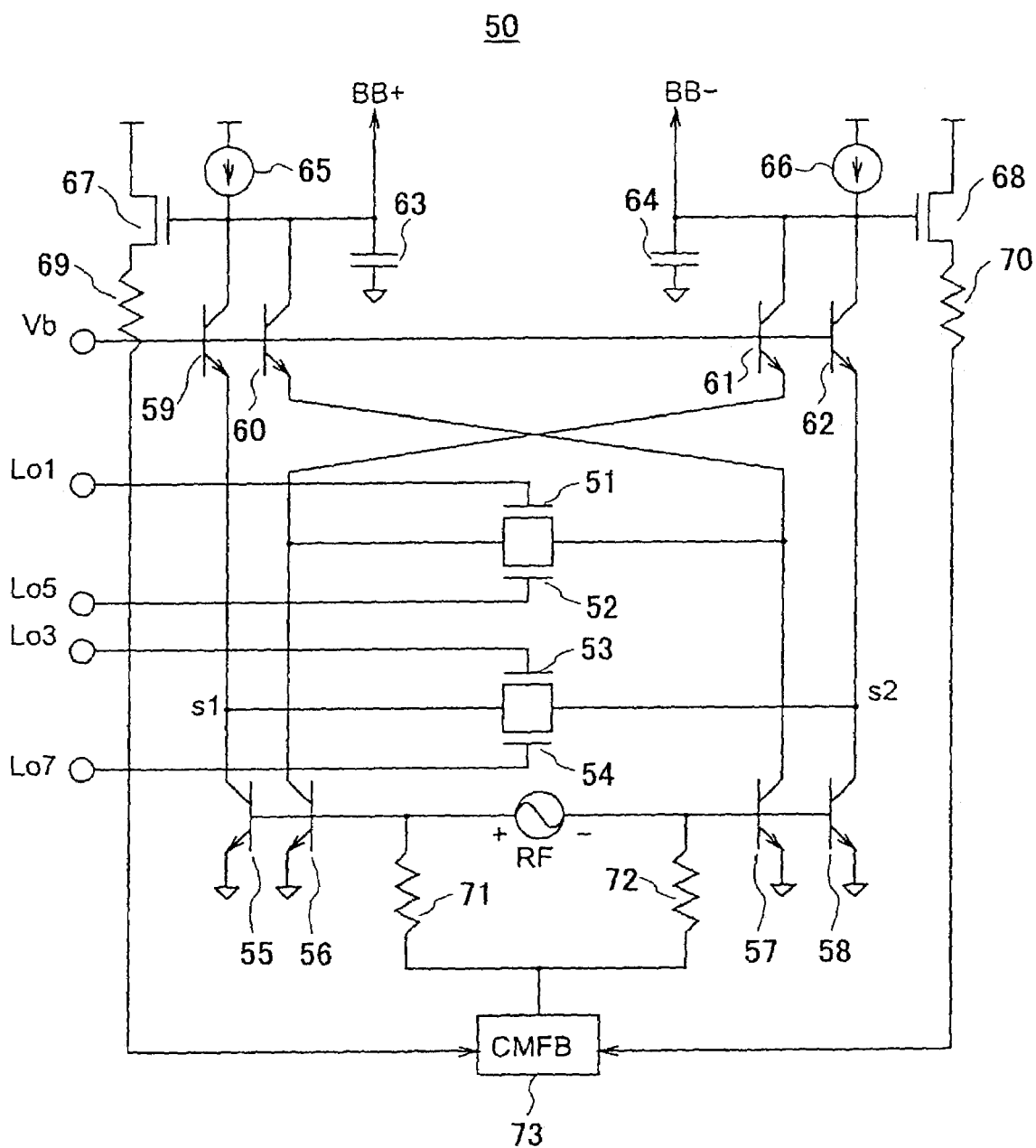
Figure 10:
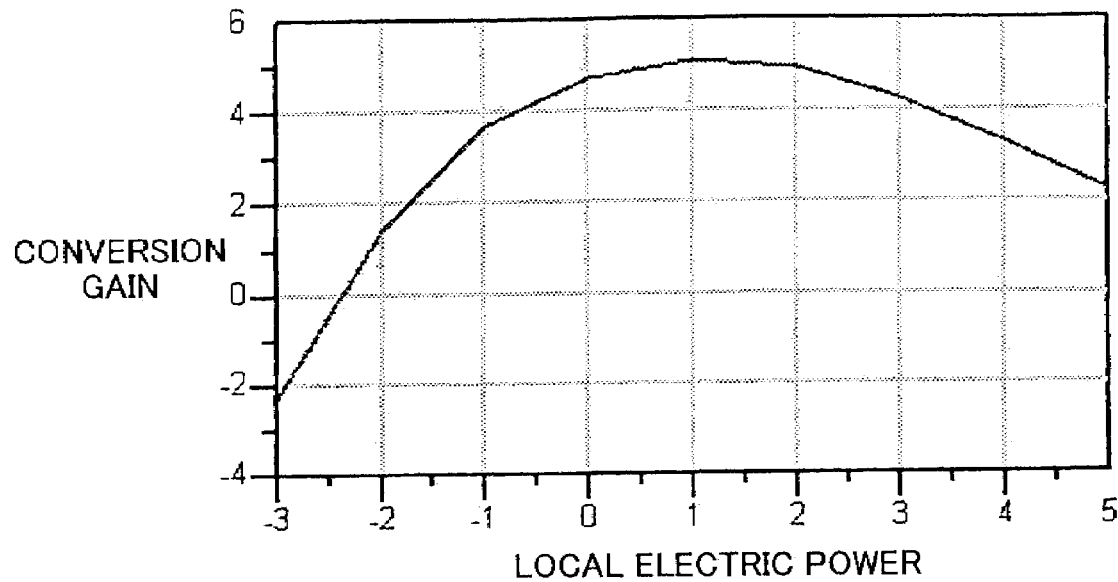
Figure 11:
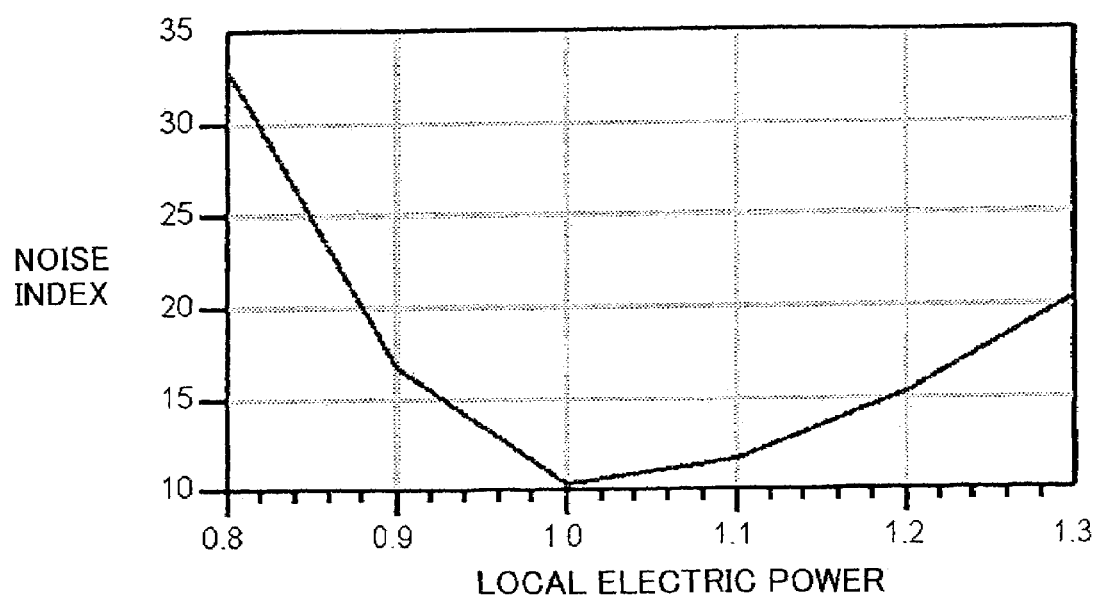
Figure 12:
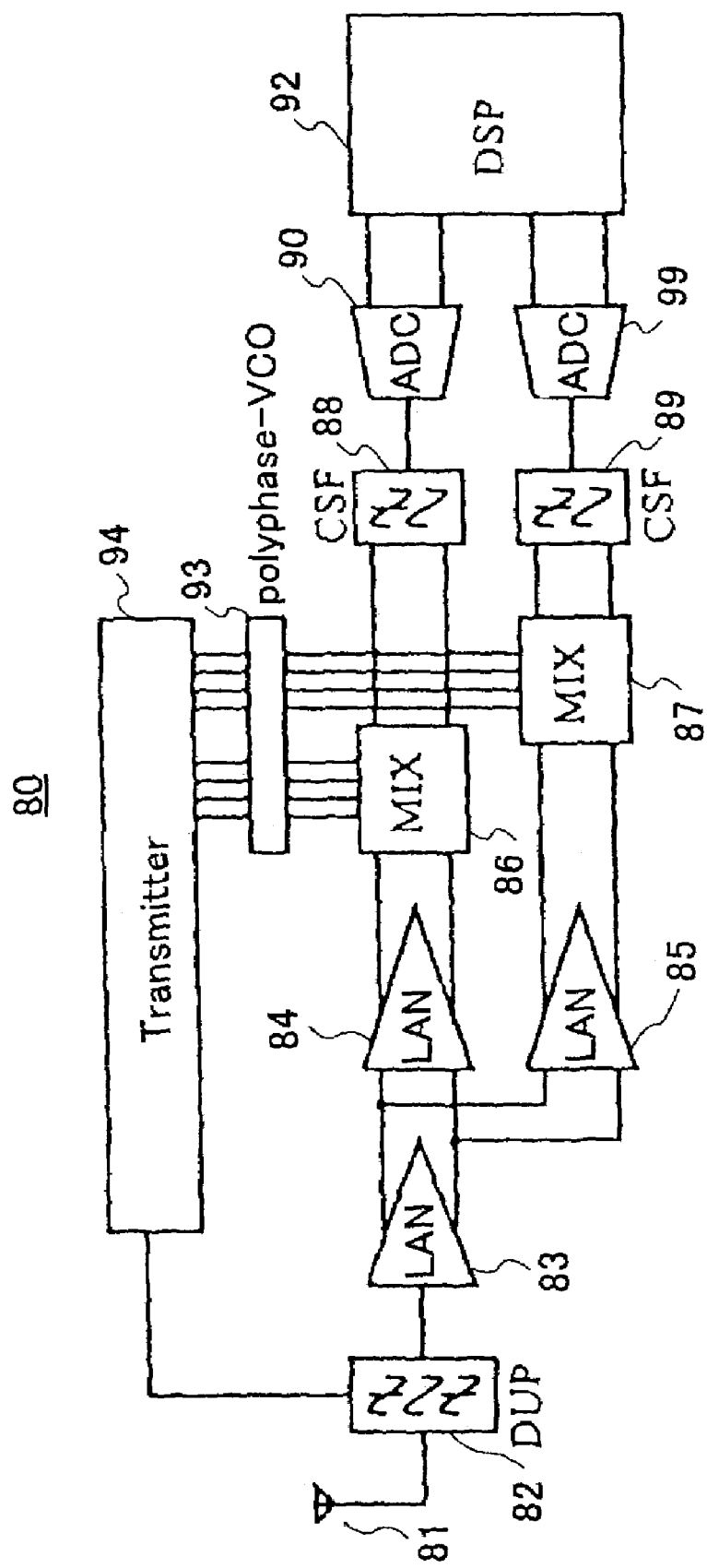
Figure 13:
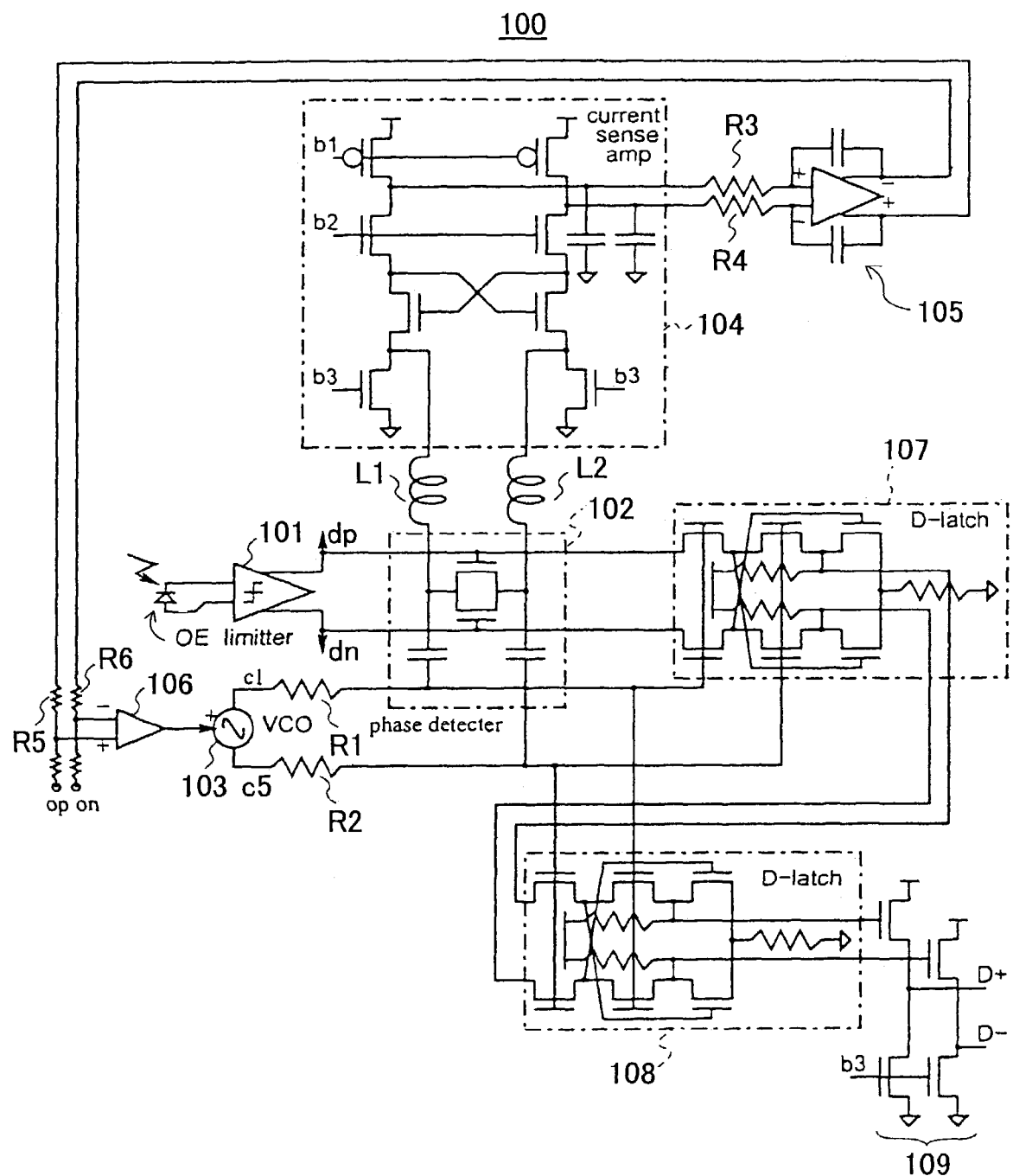
Figure 15:
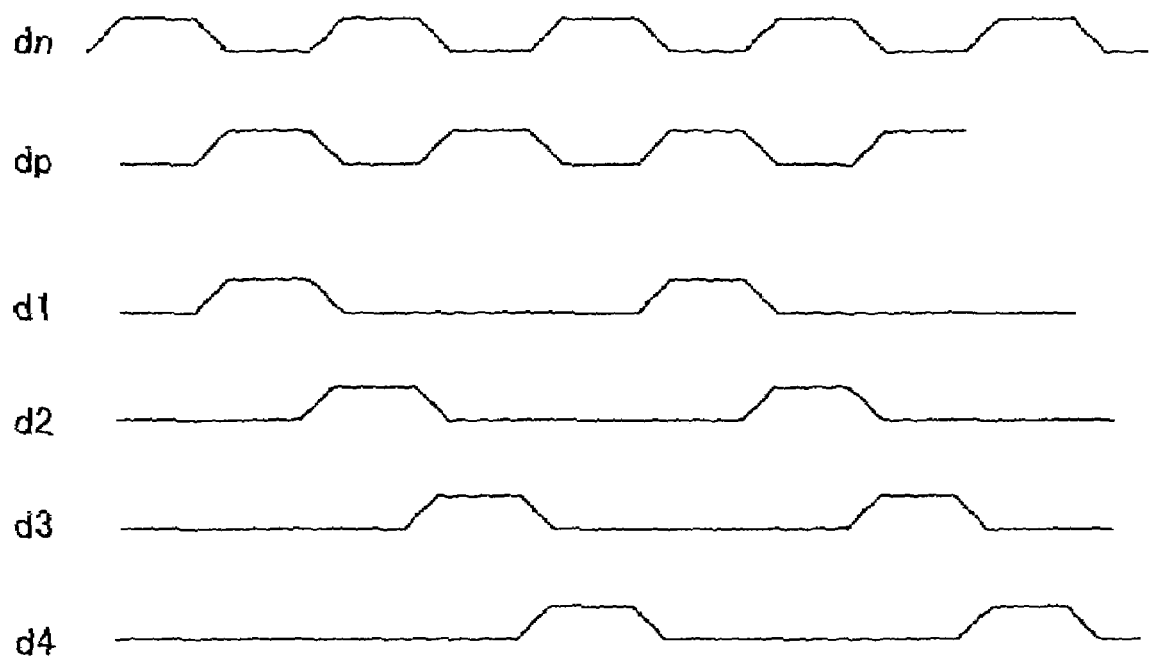
Figure 16:
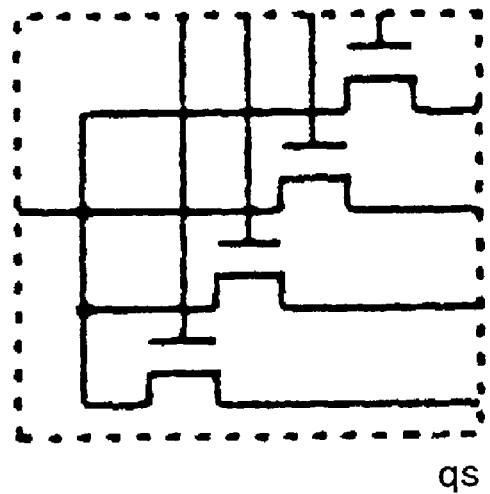
Figure 17:
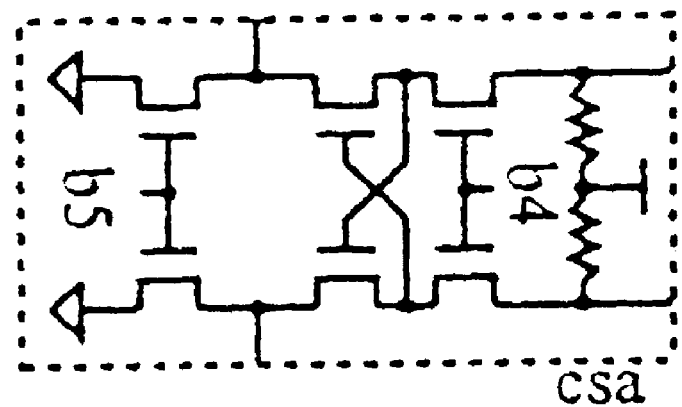
Figure 18:
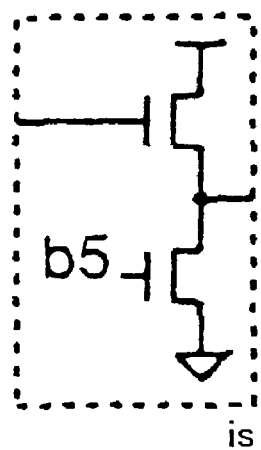
Figure 19:
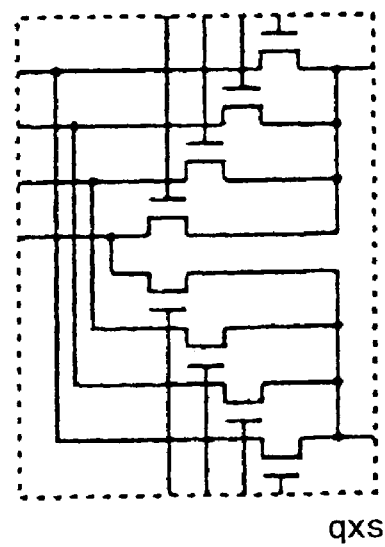
Figure 20A:
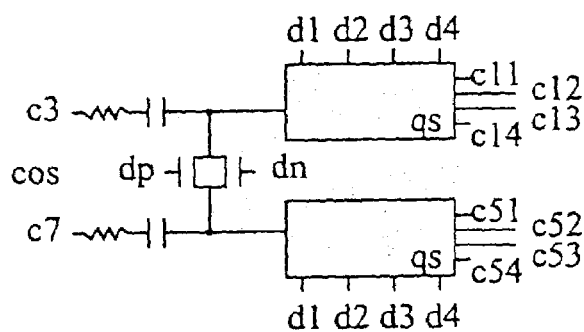
Figure 20B:
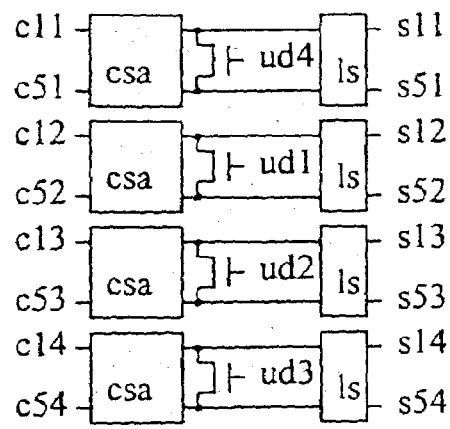
Figure 20C:
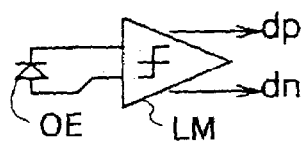
Figure 20D:
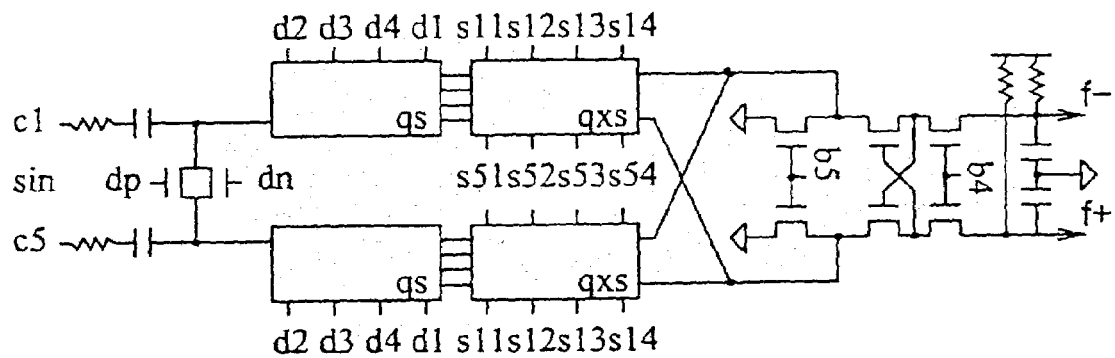
Figure 20E:
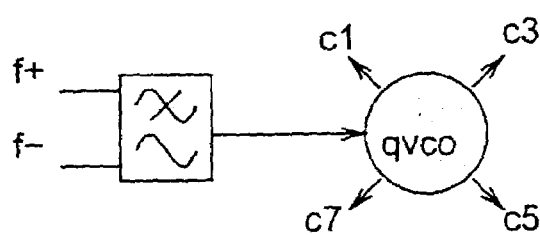
Figure 20F:
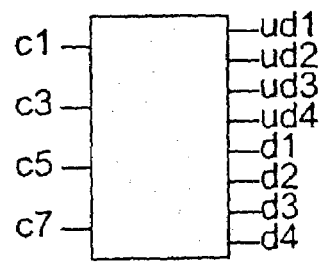
Figure 21:
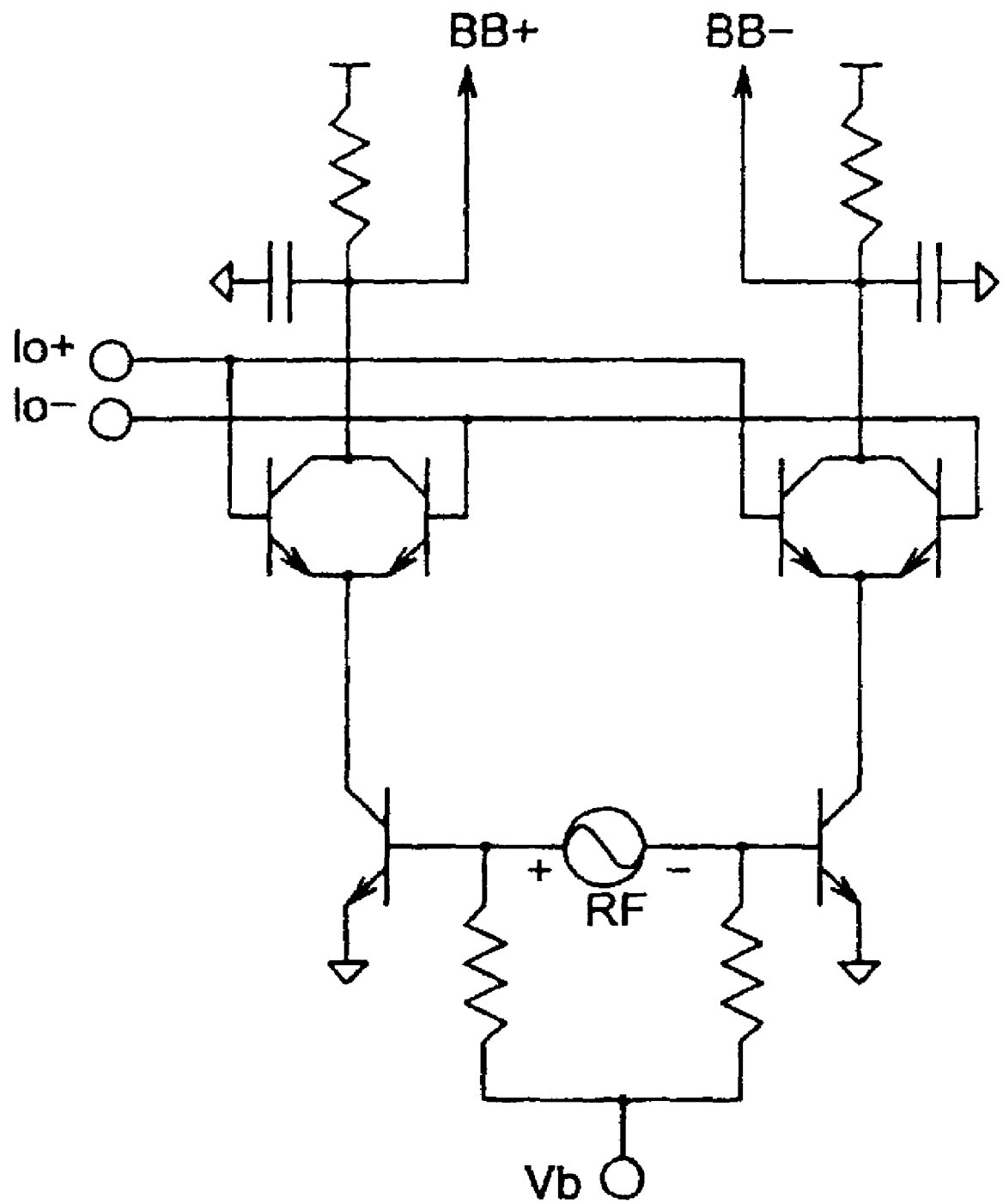
Figure 22:
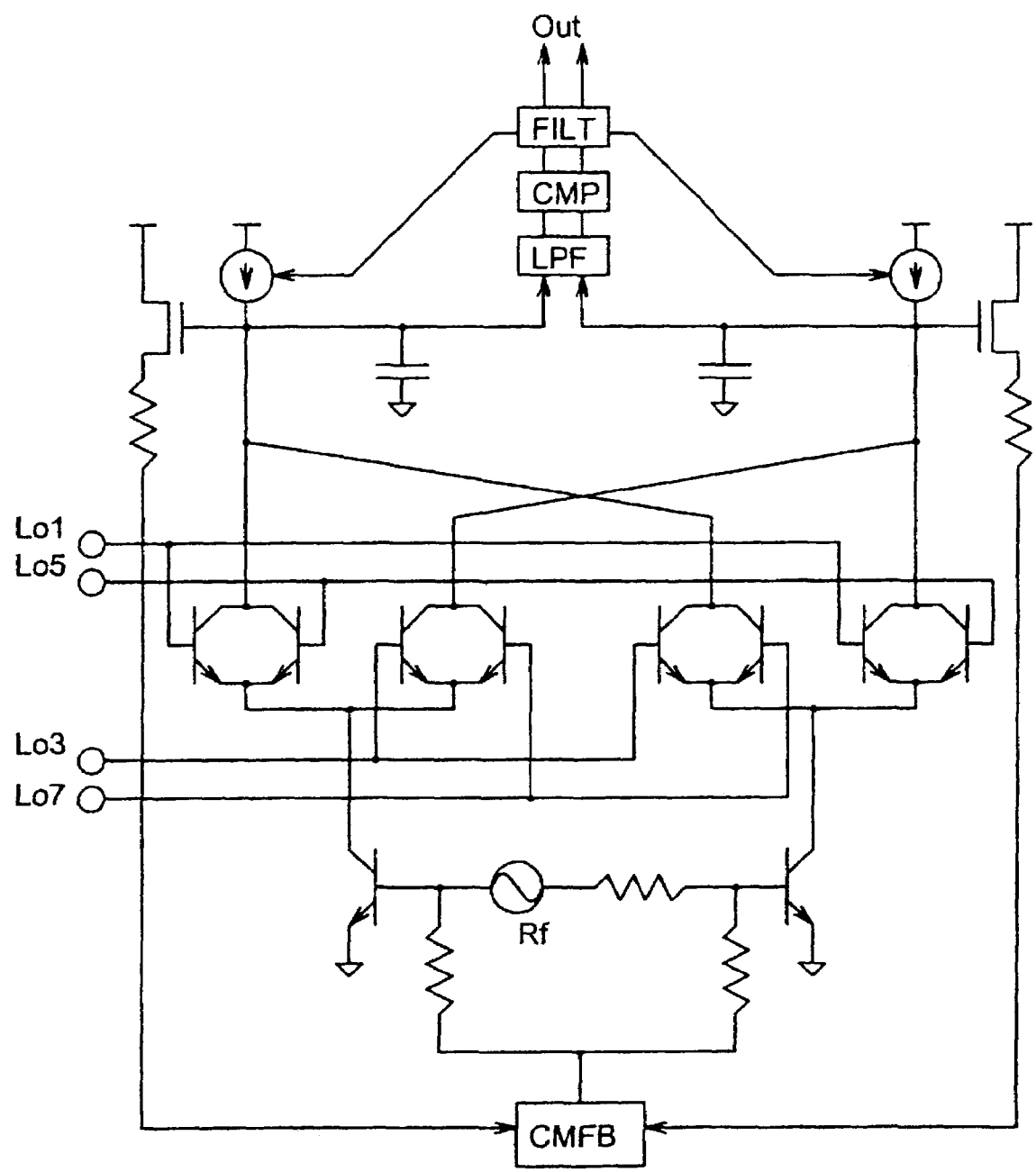
Figure 23:
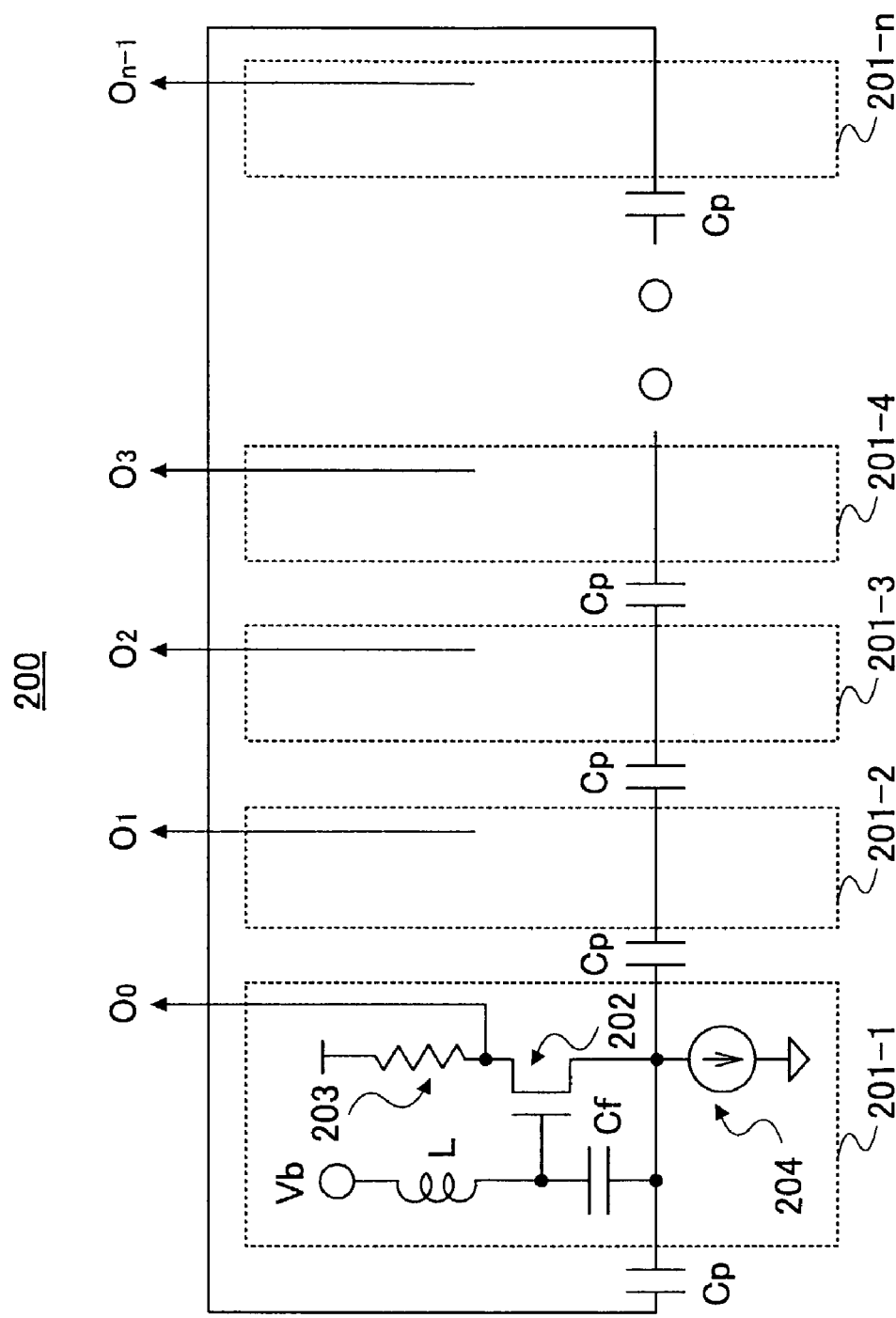
Figure 24:
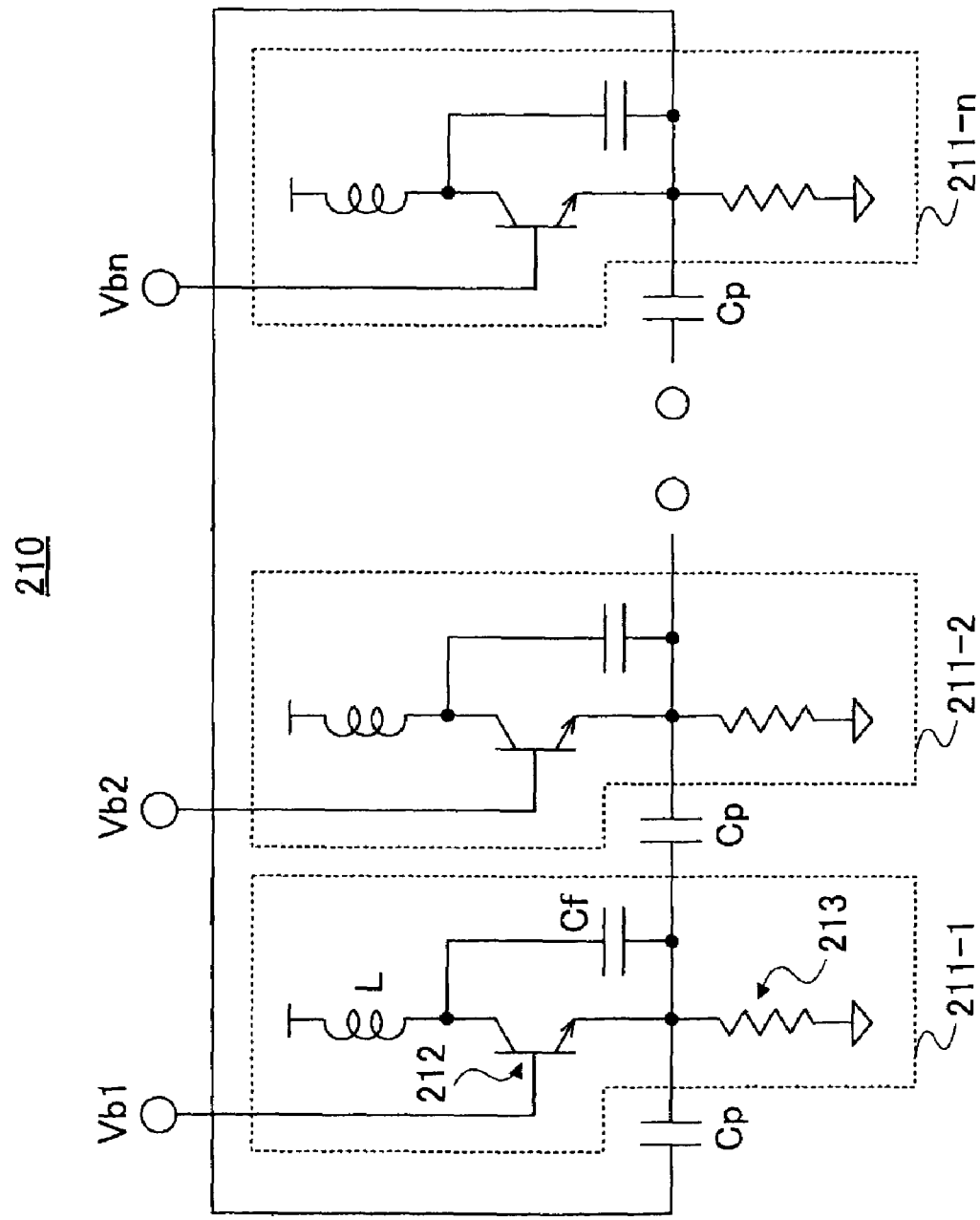
Figure 25:
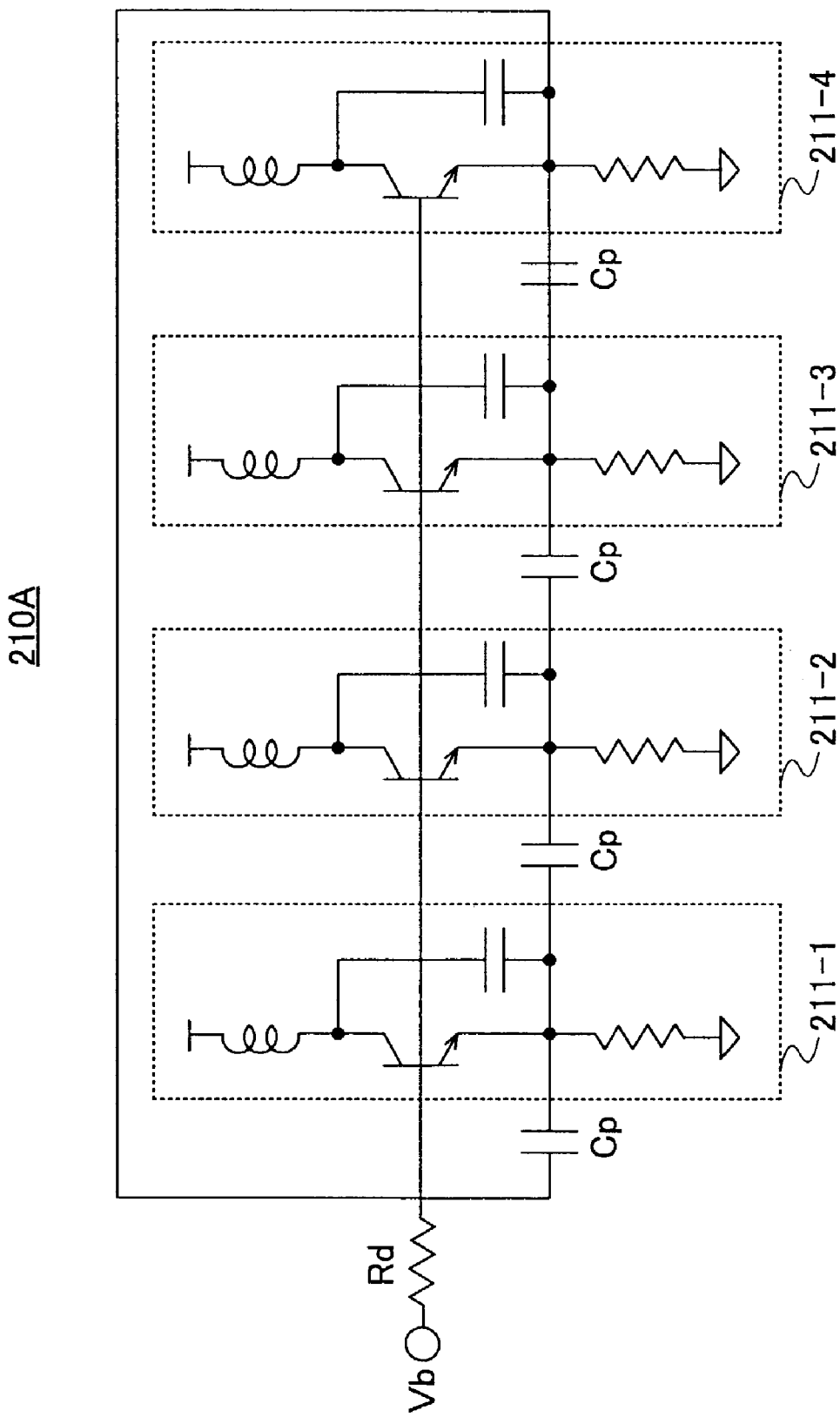
Figure 26:
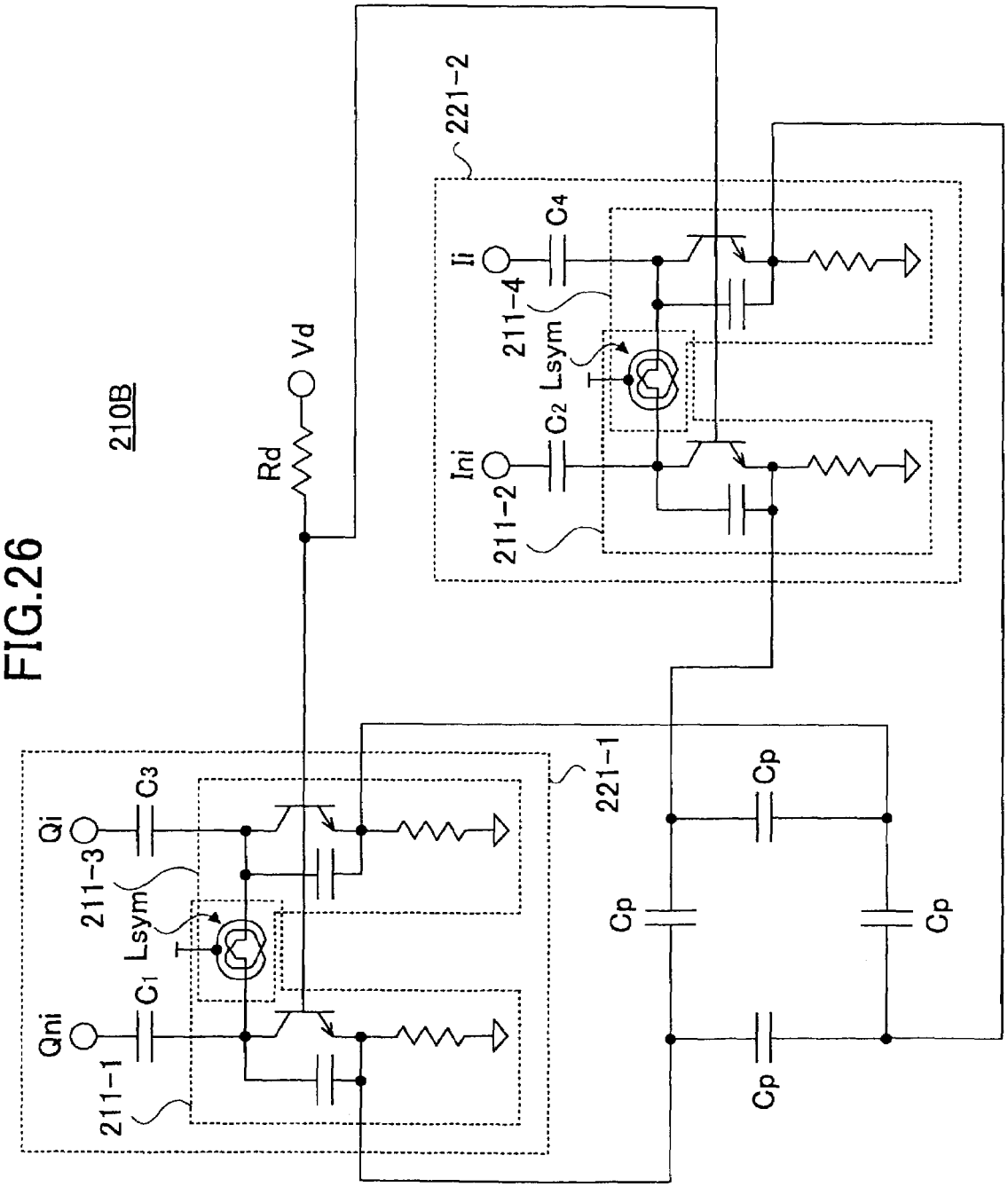
Figure 27A:
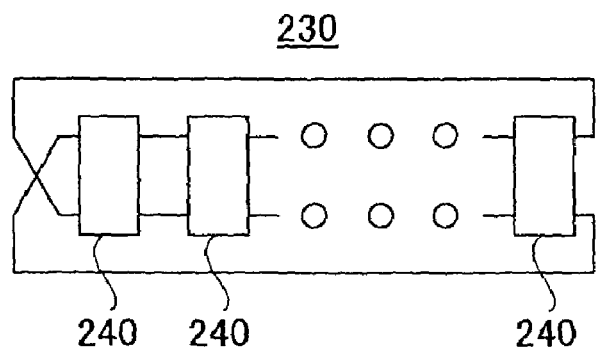
Figure 27B:
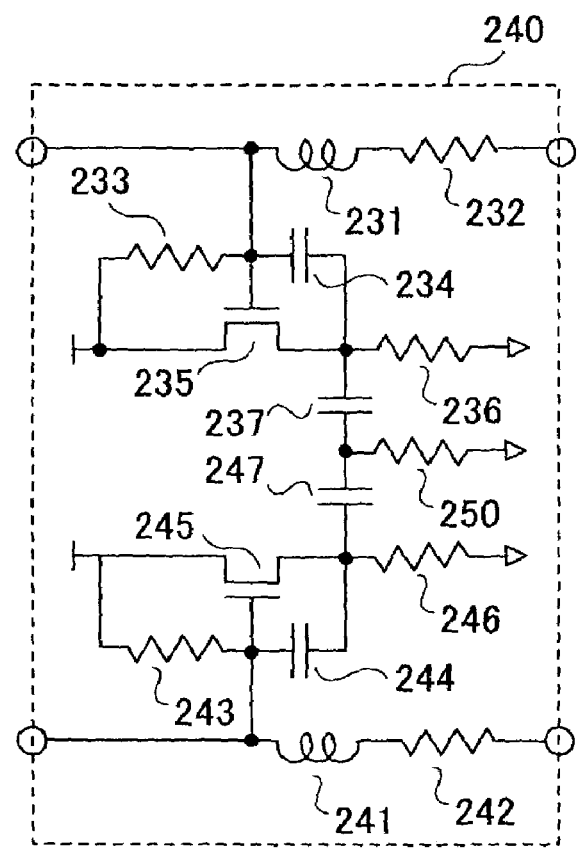

FIG. 1 is a diagram illustrating a structure of a subharmonic pumping mixer;

FIG. 2 is a diagram illustrating a characteristic of the subharmonic pumping mixer with respect to a conversion gain;

FIG. 3 is a diagram illustrating a characteristic of the subharmonic pumping mixer with respect to a noise index;

FIG. 4 is a circuit diagram illustrating a fundamental structure of a mixer circuit according to the present invention;

FIG. 5 is a circuit diagram illustrating a circuit equivalent to the mixer fundamental circuit in FIG. 4;

FIG. 6 is a diagram illustrating an operation of the equivalent circuit in FIG. 4;

FIG. 7 is a circuit diagram illustrating a first embodiment of the mixer circuit according to the present invention;

FIG. 8 is a diagram illustrating a phase relationship of a local signal supplied to a mixer fundamental circuit and an NMOS transistor in FIG. 7;

FIG. 9 is a circuit diagram illustrating a second embodiment of the mixer circuit according to the present invention;

FIG. 10 is a diagram illustrating a characteristic of the mixer circuit according to the second embodiment in FIG. 9 with respect to a conversion gain;

FIG. 11 is a diagram illustrating a characteristic of the mixer circuit according to the second embodiment in FIG. 9 with respect to a noise index;

FIG. 12 is a diagram illustrating a structure of a WCDMA transceiver employing the mixer circuit according to the present invention;

FIG. 13 is a circuit diagram illustrating an optical receiver circuit to which the mixer circuit according to the present invention is applied;

FIGS. 14A–14D are diagrams illustrating a structure of a frequency detector to which the mixer circuit according to the present invention is applied;

FIG. 15 is a diagram illustrating data signals dp and dn and divided data signals d1 through d4;

FIG. 16 is a circuit diagram illustrating an example of a circuit structure of a four-way divided circuit;

FIG. 17 is a circuit diagram illustrating a circuit structure of an example of a current sense amplifier;

FIG. 18 is a circuit diagram illustrating a circuit structure of an example of a level shifter;

FIG. 19 is a circuit diagram illustrating a circuit structure of an example of a multiplying apparatus;

FIGS. 20A–20F are diagrams illustrating a structure of a frequency lock loop wherein the structure in FIG. 14 is simplified;

FIG. 21 is a circuit diagram illustrating a circuit structure of a subharmonic steering mixer;

FIG. 22 is a circuit diagram illustrating a circuit structure of a subharmonic transfer mixer;

FIG. 23 is a diagram illustrating an example of a structure of a polyphase oscillation circuit;

FIG. 24 is a diagram illustrating another example of a structure of a polyphase oscillation circuit;

FIG. 25 is a diagram illustrating an example of a structure of an orthogonal oscillation circuit employing a Colpitts circuit;

FIG. 26 is a diagram illustrating another example of a structure of an orthogonal oscillation circuit employing a Colpitts circuit;

FIGS. 27A–27B are circuit diagrams illustrating a structure of an RTW oscillator based upon the Colpitts circuit; and FIGS. 28A–28D are circuit diagrams illustrating an optical receiver circuit to which the mixer circuit according to the present invention is applied.

DETAILED DESCRIPTION OF THE PREFERRED EMBODIMENTS

In the following, embodiments of the present invention will be described with reference to the accompanying drawings.

FIG. 4 is a circuit diagram illustrating a fundamental structure of a mixer circuit according to the present invention.

A mixer fundamental circuit 20 in FIG. 4 contains NMOS transistors 21 and 22 serving as active elements having a switching function and capacitors C1 and C2. An RF signal is supplied as a differential signal to terminals $a^+$ and $a^-$ of the mixer fundamental circuit 20 via a resistor Ri. A local signal having twice the period of a carrier wave is supplied to a gate terminal $b^+$ of the NMOS transistor 21, and a complementary signal of the local signal supplied to a gate terminal $b^+$ is supplied to a gate terminal $b^-$ of the NMOS transistor 22. The mixer fundamental circuit 20 outputs a demodulated signal to both terminals of a resistor R1. It is noted that the NMOS transistors 21 and 22 are not restricted to NMOSs and may generally be FETs (Field Effect Transistors).

Regarding the mixer fundamental circuit 20 in FIG. 4, a variation of the RF signal is transmitted to the output terminal either by short-circuiting the differential signal wherein the NMOS transistor 21 or 22 switches on in a span in which the gate terminal $b^+$ or $b^-$ is HIGH or by capacitive coupling with the capacitors C1 or C2 in the other period.

FIG. 5 is a circuit diagram illustrating a circuit equivalent to the mixer fundamental circuit 20 in FIG. 4.

The equivalent circuit 20 in FIG. 5, in which a differential input signal is illustrated as a single signal, contains switches S1 and S2 and a capacitor Cp. An RF signal is supplied to an input terminal a. The switch S1 is switched on while a local signal is HIGH. The switch S2 is switched on while a complementary signal of the local signal is HIGH.

FIG. 6 is a diagram illustrating an operation of the equivalent circuit in FIG. 4.

As is shown in FIG. 6, the RF signal is supplied to the terminal a, and the local signal and the complementary signal of the local signal are supplied to the terminals $b^+$ and $b^-$. A threshold Vth at which the switches S1 and S2 are switched on for the local signal and the complementary signal of the local signal (which corresponds to a threshold of the NMOS transistors 21 and 22 in FIG. 4) is illustrated. As is shown in FIG. 6, in a span in which the local signal or its complementary signal is more than the threshold Vth, an output terminal o in FIG. 5 is short-circuited at a ground potential through the switch S1 or S2 that is switched on, whereby an output current io becomes zero. In the other period, since the switch S1 or S2 is switched off, a voltage variation of the input RF signal is output as the output current io. As a result, a direct demodulation is realized.

An orthogonal digital modulation signal $Re[(I+jQ)e^{j\omega_c t}]$ =I cos $\omega_c$t−Q sin $\omega_c$t is set as an input signal. A local signal having twice the period of a carrier signal with a frequency $\omega_c$ becomes HIGH once every two periods, whereby the corresponding switch S1 is switched on. On the other hand, the complementary signal of the local signal becomes HIGH once every two periods of the carrier signal, whereby the corresponding switch S2 is switched on. Since the switches S1 and S2 are alternately switched on, a signal line transmitting the input signal is short-circuited to the ground in a predetermined interval for each period of the carrier signal.

If a load resistance R1 is assumed to be enough small, an instantaneous current $I_0$-inst generated on the output terminal o in a state of not being switched on is as follows;

$$I_0\text{-inst}=C_p(dV_d/dt).$$

From the instantaneous current, the output current $i_0$ per a unit time is solved as follows;

$$i_0 = \frac{\omega_c C_p}{T}\int_{t_0}^{t_0+\Delta t}(-I\sin\omega_c t - Q\cos\omega_c t)dt$$
$$= \frac{C_p}{2\pi}\int_{\phi_0}^{\phi_0+\Delta\phi}(-I\sin\phi - Q\cos(\phi))d\phi$$
$$= \frac{C_p}{2\pi}(I(\cos(\phi_0 + \Delta\phi) - \cos(\phi_0)) - Q(\sin(\phi_0 + \Delta\phi - \sin\phi_0))),$$

where T is a carrier period, $t_0$ and $\phi_0$ are a start time and a phase when the switch is switched on, respectively, and t and $\phi$ are a period and a phase period in which the switch is switched on.

Thus, if $\phi_0=0$ and the value $\Delta_\phi$ is enough smaller than $2\pi$, the current per unit time is given as $$i_0=(C_p Q\Delta\phi)/2\pi.$$

If $\phi_0=\pi/2$ and the value $\Delta_\phi$ is enough smaller than $2\pi$, the current per unit time is given as $$i_0=(C_p I\Delta\phi)/2\pi.$$

As mentioned above, when the start time when the switch begins to be switched on is set to a zero phase and a $\pi/2$ phase, it is possible to obtain an orthogonal baseband signal.

FIG. 7 is a circuit diagram illustrating the first embodiment of the mixer circuit according to the present invention.

A mixer circuit 30 contains two mixer fundamental circuits 20 as shown in FIG. 4, NMOS transistors 31 through 38, bipolar transistors 39 through 44, capacitors 45 and 46, and resistors 47 and 48. The two mixer fundamental circuits 20 receive an RF signal.

FIG. 8 is a diagram illustrating a phase relationship of local signals being supplied to the mixer fundamental circuits 20 and the NMOS transistors 31 through 38.

As is seen in FIG. 7 and FIG. 8, one of the mixer fundamental circuits 20 receives a local signal lo0 and its complementary signal lo5, and the other receives a local signal lo3 and its complementary signal lo7. From the viewpoint of frequencies of the local signals, the local signal lo0 is misaligned to the local signal lo3 by a phase of 90°. Thus, from the viewpoint of the frequency of the carrier signal RF, it is concluded that there is a discrepancy corresponding to a phase of 180°. If such two mixer fundamental circuits 20 are provided, one mixer circuit 20 is constructed to output a demodulation signal from the other mixer fundamental circuit 20 while two outputs of one of the two mixer fundamental circuits are short-circuited. In such a construction, it is possible to balance the entire circuit and prevent noise from generating.

Signals from the mixer fundamental circuits 20 are supplied to a current sense amplifier formed with bipolar transistors 39 through 44 being at the next stage via the NMOS transistors 31 through 38. Here, the NMOS transistors 31 through 38 are provided to deliver the outputs from the mixer fundamental circuits 20 to the current sense amplifier while a demodulation signal is supplied as an output in the individual mixer fundamental circuits 20, that is, the switches in individual mixer fundamental circuits 20 are not short-circuited.

The current sense amplifier formed with the bipolar transistors 39 through 44 has a small enough input impedance. The current sense amplifier receives the demodulation signals from the mixer fundamental circuits 20 as current signals, amplifies the received signals and outputs the amplified signal as voltage signals. The output voltage signals are integrated with the capacitors 45 and 46, thereby obtaining baseband signals BB+ and BB−.

Here, in order to realize an orthogonal demodulation, a circuit having the same structure as the circuit shown in FIG. 7 is added as a second circuit. The second circuit receives local signals lo2, lo6, lo4 and lo8 whose phases are misaligned by 90° to those of the local signals lo1, lo5, lo3 and lo7 supplied to the first circuit, respectively. As a result, it is possible to obtain demodulation signals whose phases are misaligned by 90° with respect to the first circuit and realize an orthogonal demodulation.

FIG. 9 is a circuit diagram illustrating a second embodiment of the mixer circuit according to the present invention.

A mixer circuit 50 in FIG. 9 contains NMOS transistors 51 through 54, transistors 55 through 62, capacitors 63 and 64, constant current sources 65 and 66, NMOS transistors 67 and 68, resistors 69 through 72, and a common mode feedback circuit (CMFB) 73.

An RF signal is supplied to bases of the transistors 55 through 58, and amplified current signals are supplied to two switches formed with the NMOS transistors 51 and 52 and the NMOS transistors 53 and 54 separately. The switch circuits correspond to those of the mixer fundamental circuit 20 formed with the NMOS transistors 21 and 22. In the second embodiment shown in FIG. 9, a current signal corresponding to the RF signal is directly supplied to the switch circuits without any capacitive coupling via a capacitor.

The local signals lo1 and lo5 are supplied as switch control signals to the switch circuit formed with the NMOS transistors 51 and 52. The local signals lo3 and lo7 are supplied as switch control signals to the switch circuit formed with the NMOS transistors 53 and 54. Phase relationship of the local signals is similar to the phase relationship shown in FIG. 8. The individual switch circuits are short-circuited once a period of the carrier signal, and there arises a phase difference of 180° with respect to a short-circuit between two of the switch circuits.

A cascode circuit formed with the transistors 59 and 60 receives an output in an RF+ side of one switch circuit and an output in an RF− side of the other switch circuit. A cascode circuit formed with the transistors 61 and 62 receives an output in an RF− side of one switch circuit and an output in an RF+ side of the other switch circuit. The capacitors 63 and 64 integrate a voltage output from the cascode circuits to obtain baseband signals BB+ and BB−.

As mentioned above, one of the cascode circuits and a baseband signal output circuit part receive the output in the RF+ side of the one of the switch circuits and the output in the RF− side of the other of the switch circuits. Thus, even if one of the switch circuits is short-circuited, a demodulation signal is supplied from the other of the switch circuits.

The baseband signals BB+ and BB− are supplied to the common mode feedback circuit 73 via the NMOS transistors 67 and 68 and the resistors 69 and 70. Based upon a feedback signal, the common mode feedback circuit 73 adjusts the voltage of the RF signal via the resistors 71 and 72, thereby operating the mixer circuit in FIG. 9 at an operating point of an appropriate voltage. As a result, it is possible to guarantee an appropriate operation even when the voltage of the current source varies, a characteristic of the device is changed, and noise is mixed with the voltage of the current source.

FIG. 10 shows a characteristic of a mixer circuit according to the second embodiment of the present invention with respect to the conversion gain. When FIG. 10 is compared to FIG. 2, it is observed that the mixer circuit according to the present invention achieves a positive gain, that is, a far larger conversion gain than a conventional subharmonic mixer.

FIG. 11 shows a characteristic of the mixer circuit according to the second embodiment shown in FIG. 9 with respect to a noise index. When FIG. 11 is compared to FIG. 3, it is observed that the mixer circuit according to the present invention achieves the minimal noise index of about 10 dB, that is, a far better noise characteristic than a conventional subharmonic mixer.

FIG. 12 is a diagram illustrating a WCDMA transceiver employing a mixer circuit according to the present invention.

A WCDMA transceiver 80 in FIG. 12 contains an antenna 81, a duplexer 82, low-noise amplifiers 83 through 85, mixers 86 and 87, channel selection filters 88 and 89, AD converters 90 and 91, a DSP (Digital Signal Processor) 92, a polyphase VCO (Voltege Controlled Oscillator) 93, and a transmitter 94.

A signal received by the antenna 81 is divided by the duplexer 82 into a signal to be delivered to the transmitter 94 and a signal to be bandwidth-filtered. The low-noise amplifiers 83 through 85 amplify received signals from the duplexer 82 and adjust gains. The mixers 86 and 87 according to the present invention receive amplified and gain-adjusted signals. Each of the two mixers 86 and 87 receives four phase local signals from eight phase local signals produced by the polyphase VCO 93 and produces orthogonal demodulated baseband signals. The baseband signals whose out-of-band signals are suppressed with the channel selection filters 88 and 89 are converted into digital signals with the AD converters 90 and 91. The DSP 92 performs a filtering process, a rake process, a code despreading process and so on for the digital signals to retrieve a signal sent to the WCDMA transceiver 80.

When the mixer circuit according to the present invention is accommodated in the above WCDMA transceiver 80, it is possible to not only suppress a DC offset caused by a local leak signal but also achieve a large gain and a good noise characteristic even if a direct demodulation circuit having properties of small size, low cost and low electric power consumption is used.

FIG. 13 is a circuit diagram illustrating an optical receiver circuit to which a mixer circuit according to the present invention is applied.

The optical receiver circuit in FIG. 13 contains a photoelectric converter OE, a limiter 101, a mixer fundamental circuit 102, a VCO 103, a current sense amplifier 104, a loop filter 105, a differential amplifier 106, D flip-flops 107 and 108, and an output circuit 109. Resistors R1 through R6 and inductors L1 and L2 are provided as components serving to connect between the circuits.

An optical input is converted into an electric signal by the photoelectric converter OE and then its waveform is shaped for the mixer fundamental circuit 102 according to the present invention. As long as the optical signal has a property of a NRZ (nonreturn-to-zero), the optical signal, which may be a binary burst signal or a random pattern, has a fundamental wave component formed of less than half of a clock signal.

In the optical receiver, it is necessary to extract the clock signal from the received signal and incorporate the received signal by using the extracted clock signal. In the construction shown in FIG. 13, a shaped received signal is used as a switch control signal of the mixer circuit according to the present invention. As mentioned above, since the mixer circuit according to the present invention employs a local signal whose frequency is half of the frequency of a carrier signal, it is possible to detect a phase of the frequency of the carrier signal. Similarly, it is possible to detect a phase of the clock signal in the construction shown in FIG. 13 by controlling the switches based upon a fundamental wave whose frequency is half of the clock signal included in the received signal.

Namely, the mixer fundamental circuit 102 detects a phase of a frequency component corresponding to the clock signal of the received signal from output signals of the VCO 103 by using the shaped received signal as a local signal, and then the detected phase is produced as a current signal. The operation regarding the mixer fundamental circuit corresponds to a phase comparison operation. Low-frequency components of the output current signal are supplied to the current sense amplifier 104 via the inductors L1 and L2. Voltage outputs of the signals amplified by the current sense amplifier 104 are returned as feedbacks to the VCO 103 via the loop filter 105 and the differential amplifier 106. The feedback signals control an oscillation of the VCO 103 and form a phase synchronous loop.

Outputs of the VCO 103 controlled by the loop become clock signals synchronous to the clock signals included in the received signal, and then the resulting clock signals are supplied to the D flip-flop 107 and 108. The D flip-flops 107 and 108 form a master-slave latch circuit and latch the received data in synch with the clocks. The latched signals are output as output signals D+ and D− via the output circuit 109.

The phase comparison unit for a received PLL of an optical fiber and binary communication is basically equivalent to a phase detector. Thus, a conventional multiplying circuit such as Gilbert cell is used as a mixer circuit in an RF receiver together with a phase comparison unit in an optical receiver. In general, since the RF signal is weak, the RF mixer should have certain properties: low noise, low phase noise, high conversion gain and low distortion. Since the PLL of the optical receiver receives a VCO output and a received data signal sufficiently amplified and clipped as its input signals, it is necessary to execute an operation at high speed instead of the requirement of high performance for noise and conversion gain. Furthermore, there might be another requirement for small size and low electric power consumption. If the mixer circuit according to the present invention is used, it is possible to implement a small and low electric power consuming optical receiver achieving high speed and low phase noise.

FIG. 14 is a diagram illustrating a structure of a frequency detector to which the mixer circuit according to the present invention is applied. The frequency detector is formed by integrating structures in FIG. 14A through FIG. 14D.

In the construction in FIG. 13, although the phase synchronous loop is used to synchronize a phase with a clock signal component in a received signal, it is not actually sufficient to simply adjust the phase. It is necessary to detect a frequency and control an oscillating frequency of the VCO so as to cause the detected frequency to coincide with the frequency of the clock signal in the received signal. FIG. 14 is a circuit diagram illustrating the frequency detector for the purpose.

Figure 14B:
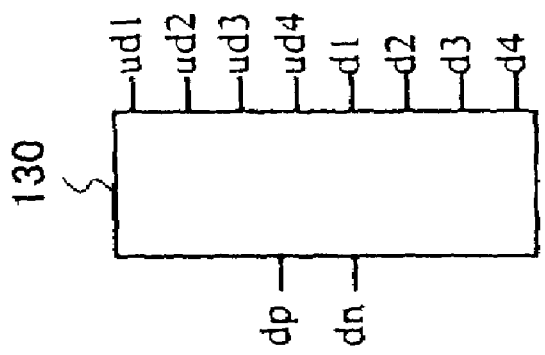
Figure 14A:
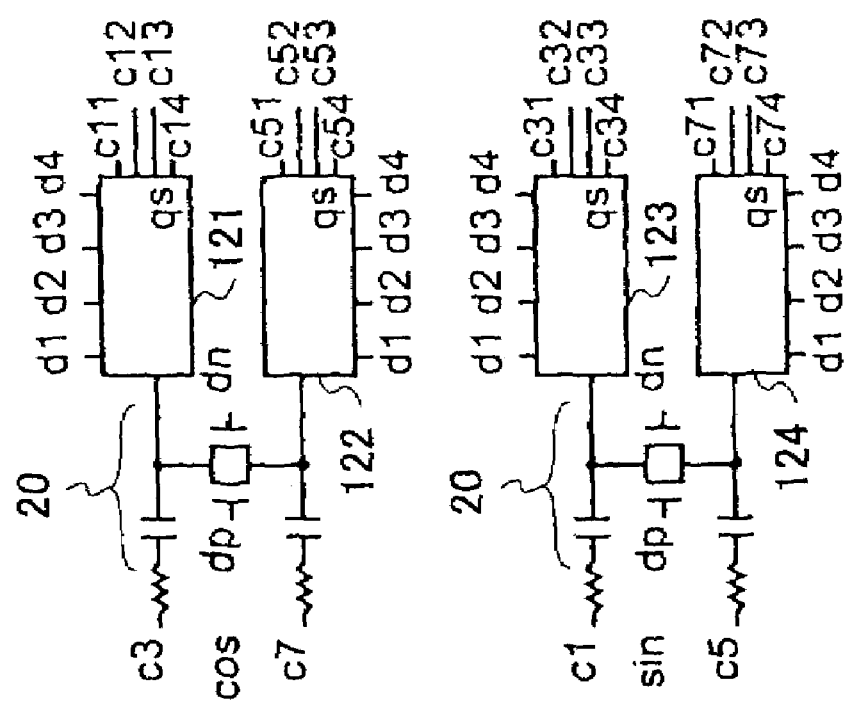

FIG. 14A shows a structure in which four distribution circuits 121 through 124 are connected to outputs of the mixer fundamental circuits 20. For example, the two mixer fundamental circuits 20 receive data signals dp and dn corresponding to the signals D+ and D− detected by the circuit shown in FIG. 13 as local signals to control switches. One of the mixer fundamental circuits receives an in-phase clock c1 and its complementary clock c5, and the other of the mixer fundamental circuits receives an orthogonal phase clock c3 and its complementary clock c7. As a result, an orthogonal phase signal is generated by detecting a phase at the time t1.

FIG. 14B shows a demultiplexer 130 to which the data signal dp and dn are given as its inputs. The demultiplexer 130 four-way demultiplexes the data signals dp and dn in order to generate four demultiplexed data signals d1 through d4 each of which has a different phase from the others. Also, the demultiplexer 130 generates high voltage level demultiplexed data signals ud1 through ud4 whose voltages are set at a higher level and whose logic is the same as the demultiplexed data signals d1 through d4. FIG. 15 shows the data signals dp and dn and the demultiplexed data signals d1 through d4.

In FIG. 14A, when the demultiplexed data signals d1 through d4 are supplied to the quarter-split circuits 121 through 124, a detected clock signal, which is an orthogonal phase signal, is interleaved in four divisions. FIG. 16 shows an example of a circuit structure of the quarter-split circuits 121 through 124.

Figure 14C:
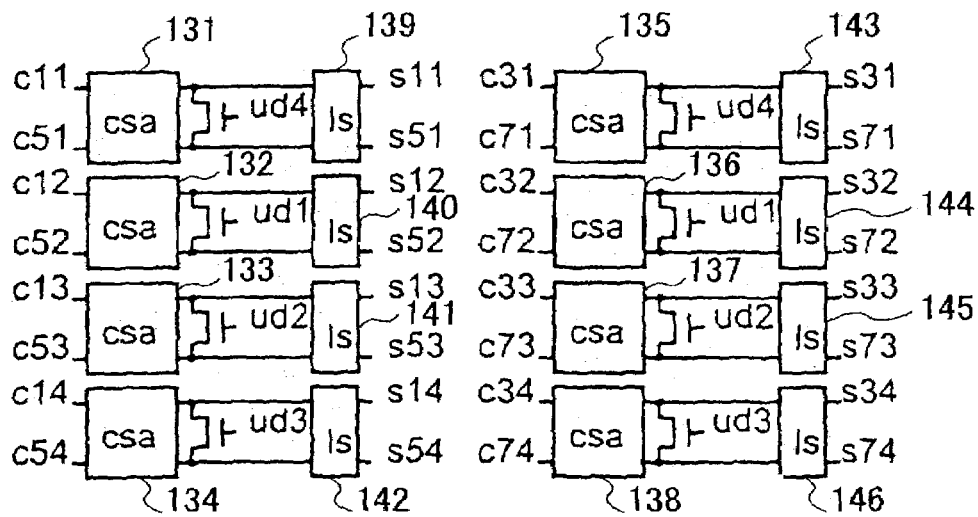

FIG. 14C shows current sense amplifiers 131 through 138 and level shifters 139 through 146. The current sense amplifiers 131 through 138 receive and amplify four-divided interleave signals c11–c14, c51–c54, c31–c34 and c71–c74 generated by the quarter-split circuits 121 through 124. The amplified voltage signals are reset by the NMOS transistors to which interleaving clocks udl1 through udl4 of an approximate 1 data width are gate-input. The voltage levels of the amplified voltage signals are decreased by level shifters 139 through 146, and are output as orthogonal phase signals s11–s14, s31–s34, s51–s54 and s71–s74. FIG. 17 shows an example of a circuit structure of the current sense amplifiers 131 through 138. FIG. 18 shows an example of a circuit structure of the level shifters 139 through 146.

Figure 14D:
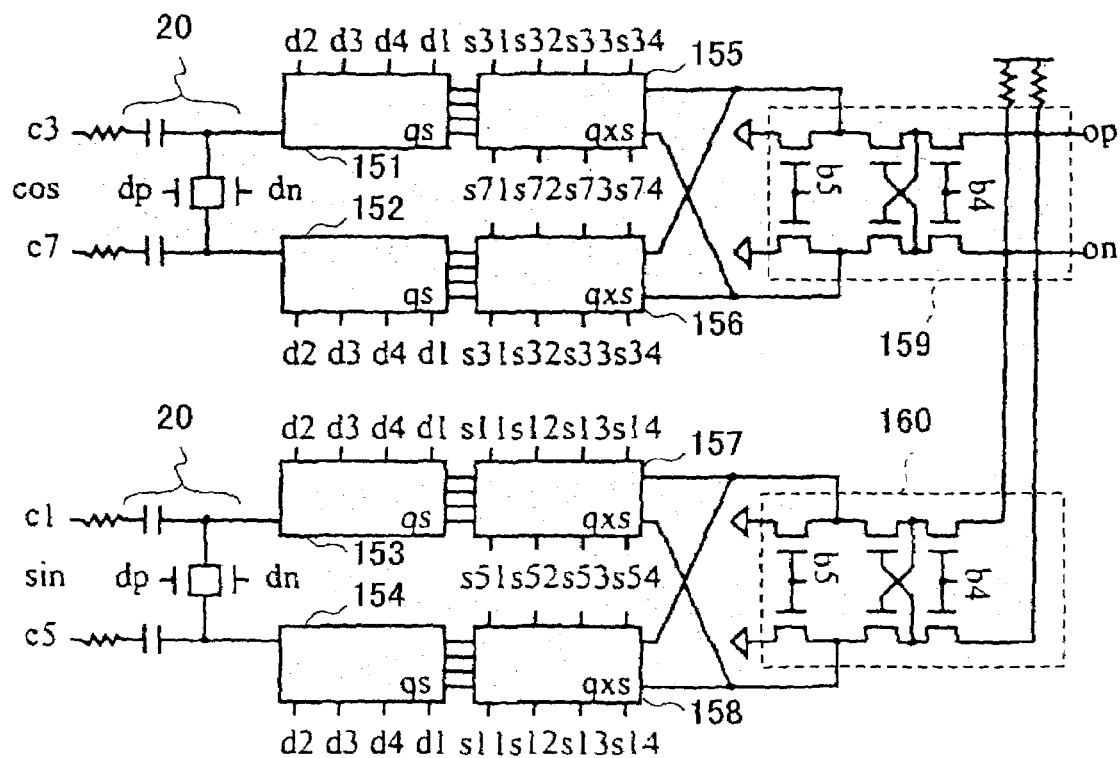

FIG. 14D shows the mixer fundamental circuits 20, quarter-split circuits 151 through 154, multipliers 155 through 158 and current sense amplifiers 159 and 160, respectively. The mixer fundamental circuits 20 and the quarter-split circuits 151 through 154 generate orthogonal phase signals demodulated by data signals at the time t2 with respect to the clock signals c1 and c5 and the clock signals c3 and c7. The multipliers 155 through 158 multiply the orthogonal phase signals being at the time t2 and orthogonal signals s11–s14, s31–s34, s51–s54 and s71–s74 being at the time t1, and the outputs are supplied to the current sense amplifiers 159 and 160. Frequency error signals "op" and "on" are obtained by adding outputs of the current sense amplifiers 159 and 160. FIG. 19 shows an example of a circuit structure of the multipliers 155 through 158.

A frequency error fe is given by the following formula;

$$fe = d\phi/dt \approx (\phi_{t2} - \phi_{t1})/\Delta T.$$

In the vicinity of zero, the value $\phi_{t2} - \phi_{t1}$ is approximated to;

$$\exp[j(\phi_{t2} - \phi_{t1})] \approx 1 + j(\phi_{t2} - \phi_{t1}).$$

From the above approximation, since an imaginary part of the formula $\exp[j(\phi_{t2} - \phi_{t1})]/\Delta T$ is an approximate value, the frequency error fe is represented by the following formula;

$$fe \approx (\sin \phi_{t2} \cos \phi_{t1} - \cos \phi_{t2} \sin \phi_{t1})/\Delta T,$$

where $\Delta T$ is a data transition interval. In the construction shown in FIG. 14, the frequency error fe is computed in accordance with the above formula. Although the data transition interval $\Delta T$ is not included in the outputs of the construction, the construction can be easily implemented. Since only the polarity of the frequency error fe is important in most cases, the construction in FIG. 14 can be used in practice. Here, when burst data formed of 0/1 alternating codes are used, $\Delta T$ becomes a data transfer period. Even if a random pattern is used, the signal is attenuated in the range $\Delta T \gg 2\pi\sqrt{RC}$, where R and C are a resistor component and a capacitance component of an output impedance of the current sense amplifier, respectively. Thus, it is possible to avoid the problem that the value $\sin(\phi_{t2} - \phi_{t1})$ in the above formula is valid only in the range from $-\pi$ to $\pi$.

FIG. 20 shows a frequency lock loop having a structure simplified from the structure in FIG. 14. FIG. 20A shows a mixer fundamental circuit and quarter-split circuits (qs) corresponding to FIG. 14C. FIG. 20C shows a photoelectric converter OE generating the corresponding electric signal from a received optical signal and a limiter LM shaping a waveform of the electric signal. FIG. 20D shows a mixer fundamental circuit, quarter-split circuits (qs), multipliers (qxs) and a current sense amplifier corresponding to the structure in FIG. 14D. In FIG. 20E, frequency error signals f+ and f− detected in the structures of FIG. 20A through FIG. 20D are set as inputs, and clock signals c1, c3, c5 and c7 are generated by controlling the frequencies of the inputs according to the inputs. When the generated clock signals c1, c3, c5 and c7 are given as their inputs to the structures of FIG. 20A through FIG. 20D, a frequency lock loop is formed by receiving a feedback. FIG. 20F shows a demultiplexer generating demultiplexed signals from the clock signals c1, c3, c5 and c7. The demultiplexed signals are supplied to individual quarter-split circuits.

In the following, a subharmonic steering mixer and its variations will be described.

FIG. 21 is a circuit diagram illustrating a circuit structure of the subharmonic steering mixer.

The circuit structure in FIG. 21 such that a signal is transmitted therein as a differential local signal is known as a conventional technique. In this case, since a signal having half of the frequency of a carrier signal is used, it is possible to prevent a DC offset caused by self demodulation of a leaked local signal. However, since a signal having the frequency of the carrier signal is generated in a common emitter node by Cbe of a transistor to which a local signal is input, it is impossible to prevent Ccb of an RF input transistor from leaking to an RF signal. Namely, measures for the local leak are incomplete, and it is impossible to use the circuit structure for a WCDMA receiver wherein an accurate direct demodulation is required.

FIG. 22 is a circuit diagram illustrating a circuit structure of a subharmonic transfer mixer in which a Gilbert cell is formed with an orthogonal differential local signal whose local frequency is equal to a carrier frequency.

As is shown in FIG. 22, when a circuit is provided to have the structure in which a Gilbert cell is formed with an orthogonal differential local signal whose local frequency is equal to a carrier frequency, the equation 2Fcarrier=4Flo is satisfied with respect to a local higher harmonic generated in a collector of an RF input transistor. Thus, the problem is solved. In FIG. 22, CMFB, LPF, CMP and FILT represent a common mode feedback circuit, a LOW pass filter, a comparator and a digital filter, respectively. A current source controlled by LPF, CMP, FILT and a FILT output form a ΣΔA/D converter and a receiver filter or a portion of the receiver filter.

In an embodiment of the above-mentioned mixer circuit and an embodiment of its application, a polyphase oscillation circuit is used to obtain a local signal. In the following, a description will be given of an example of a structure of such a polyphase oscillation circuit. In order to ensure the performance of individual circuits, it is preferred to use a polyphase oscillation circuit as shown in the following to provide a local signal of low-phase noise or a clock of a low-timing jitter to the above mixer circuit or a phase/frequency detector. However, the present invention is not limited to the use of the polyphase oscillation circuit.

FIG. 23 is a diagram illustrating an example of a structure of a polyphase oscillation circuit. In the structure example, a polyphase oscillator with more than or equal to three phases is provided to combine individual oscillators of Colpitts circuits.

A polyphase oscillator 200 contains a plurality of Colpitts circuits 201-1 through 201-$n$ and a plurality of capacitors Cp. The Colpitts circuits 201-1 through 201-$n$ are connected in a chain via the capacitors Cp and are formed as a loop by connecting both ends of the chain. The Colpitts circuits 201-1 through 201-$n$ have identical structures. The individual Colpitts circuit contains an NMOS transistor 202, a resistor 203, a constant current source 204, an inductor L and a capacitor Cf.

When the phase difference between adjacent Colpitts circuits is small, the amplitude is enlarged by the overlap of waves. As a result, the individual Colpitts circuits work to restrict the amplitude. When an oscillation phase difference between adjacent Colpitts circuits is larger than $2\pi/n$, there arises a portion having a small phase difference at another place in the loop, thereby restricting the amplitude at that place. As for the above process, an oscillation is attenuated through the above amplitude restriction if the oscillation has an oscillation phase difference larger than $2\pi/n$ or smaller than $2\pi/n$. Consequently, only a wave whose oscillation phase difference between adjacent Colpitts circuits is just equal to $2\pi/n$ can grow in amplitude in collaboration with the adjacent Colpitts circuits, thereby obtaining the stable oscillation.

FIG. 24 shows another example of a structure of a polyphase oscillation circuit. In the example, a polyphase oscillator with n phases is formed by base-grounding Colpitts circuits.

A polyphase oscillator 210 in FIG. 24 contains a plurality of Colpitts circuits 211-1 through 211-$n$ and a plurality of capacitors Cp. The Colpitts circuits 211-1 through 211-$n$ are connected in a chain through the capacitors Cp and are formed in a loop by connecting both ends of the chain. The Colpitts circuits 211-1 through 211-$n$ have identical structures. The individual Colpitts circuit contains a bipolar transistor 212, a resistor 213, an inductor L and a capacitor Cf. Here, the bipolar transistor 212 may be an NMOS transistor.

Bias voltages Vb1 through Vbn are applied to bases, which are control ends of the transistors (gates in NMOS transistors). At the starting time of an oscillation, when bias voltages are sequentially applied to a part or all of the bias voltages Vb1 through Vbn, it is possible to determine a sign of the oscillation phase difference between adjacent Colpitts circuits. Outputs of the oscillator in FIG. 23 are obtained through collectors or emitters of the bipolar transistors 212.

Among some types of polyphase oscillation circuits, an orthogonal (four phase) oscillator is the most commonly used. The orthogonal (four phase) oscillator is formed by providing four Colpitts circuits to the oscillation circuit shown in FIG. 24. Since the orthogonal (four phase) oscillator works poorly to correct a phase between adjacent Colpitts circuits in a steady oscillation state, there is a possibility that the phase error becomes large depending on device selections and the circuit structure. Thus, it is necessary to take measures for solving the problem.

FIG. 25 shows an example of a structure of an orthogonal oscillation circuit with Colpitts circuits. In FIG. 25, the same parts as those parts in FIG. 24 are referred to as the same numerals. The orthogonal oscillator in FIG. 25 is provided with a resistor Rd to realize a stable oscillation.

An orthogonal oscillation circuit 210A in FIG. 25 contains a plurality of Colpitts circuits 211-1 through 211-4, a plurality of capacitors Cp and the resistor Rd. One end of the resistor Rd is connected to bases of transistors of individual Coplitts circuits 211-1 through 211-4, and a bias voltage Vb is applied to the other end.

When the bias voltage Vb is supplied to the bases of the individual transistors via the resistor Rd, there arises a voltage drop in the resistor Rd in proportion of the flow amount of the current, thereby decreasing the voltage in the bases. Some cases are supposed with respect to the above problem, for example, the case in which two of four oscillation circuits oscillate together around a phase of 0° because the two oscillation circuits have close oscillation phases and the other two oscillation circuits also oscillate together around a phase of 180° because the other two oscillation circuits also have close oscillation phases. In this case, since there are base current flows corresponding to two transistors around the phases of 0° and 180°, the voltage drop in the resistor Rd becomes large, thereby considerably decreasing the base voltages. Conversely, since there are little base current flows around phases of 90° and 270°, the voltage drop does not arise in the resistor Rd, thereby rarely decreasing the base voltages. Thus, transistors are difficult to switch on around the phases of 0° and 180°, in other words, a suppression function works around the phases of 0° and 180°, whereas transistors are easy to switch on around phases of 90° and 270°, in other words, an induction function works around phases of 90° and 270°.

As mentioned above, the resistor Rd not only prevents a plurality of transistors from simultaneously switching on but also serves to avoid a phase condition in which no transistor switches on. As a result, it is possible to realize a condition in which individual Colpitts oscillation circuits separately oscillate in different phases and the base currents become constant in a whole range of phases from 0° to 360°. Namely, it is possible to realize a steady state in which four Colpitts oscillation circuits sequentially oscillate at phase differences of 90°.

The resistor Rd may be set in a range from a few ohms to scores of ohms, or an internal resistance in the source of the bias voltage Vb may function instead of the resistor Rd.

In the following, a description will be given of an oscillation frequency of a polyphase oscillation circuit with Colpitts circuits.

When adjacent Colpitts circuits in an n-phase oscillation circuit operate in a phase difference $2\pi/n$, an oscillation phasor of the adjacent Colpitts circuits is given by the formula;

$$Ae^{i(\theta \pm 2\pi/n)},$$

where $Ae^{i\theta}$ is an oscillation phasor of the Colpitts circuit of interest. Using a capacitance Cp for a connection between the adjacent Colpitts circuits, a resonant capacitance Cr is represented as follows;

$$Cr=Cp|2e^{i\theta}-e^{i(\theta+2\pi/n)}-e^{i(\theta-2\pi/n)}|.$$

The resonant capacitance Cr contributes to a charge transmission between the adjacent Colpitts circuits. Accordingly, an oscillation angle frequency is given by the following formula;

$$\omega_{osc}=((Cf+Cr)/(LCfCr))^{1/2},$$

whereby the oscillation angle frequency is valid in the range $n \geq 2$.

FIG. 26 shows another example illustrating a structure of an orthogonal oscillation circuit with Colpitts circuits. In FIG. 26, the same parts as those in FIG. 25 are referred to as the same numerals and the description thereof will be omitted.

An orthogonal oscillation circuit 210B in FIG. 26 contains oscillation circuits 221-1 and 221-2 integrally formed with two Colpitts circuits whose phases are opposite to each other, a plurality of capacitors Cp and a resistor Rd. As is shown in FTG. 26, the oscillation circuits 221-1 and 221-2 have identical structures. The oscillation circuit 221-1 contains two Colpitts circuits 211-1 and 211-3 whose phases are opposite to each other and capacitors C1 and C3. Inductors of the Colpitts circuits 211-1 and 211-3 are trans-connected to be reverse-wound to each other and form a symmetrically connected inductor Lsym. The symmetrically connected inductor Lsym controls the Colpitts circuits 211-1 and 211-3 so that the Colpitts circuits 211-1 and 211-3 can oscillate in a reversed phase. In the construction, it is possible to realize a state in which the resistor Rd works similarly to the circuit structure in FIG. 25, individual Colpitts circuits separately oscillate in different phases, and the base current remains constant in a whole phase range from 0° to 360°.

FIG. 27 is a circuit diagram illustrating a structure of a RTW oscillator based upon Colpitts circuits. The RTW (Rotary Traveling-Wave) oscillator is a polyphase oscillator formed by connecting a large number of multi-vibrators in a differential transmission line and is designed to distribute clocks of a digital circuit. By replacing the multi-vibrators in a conventional RTW oscillator with Colpitts circuits, a Colpitts RTW oscillator 230 is formed as shown in FIG. 27.

A Colpitts RTW oscillator 230 shown in FIG. 27A is formed by connecting a plurality of Colpitts circuit oscillators 240. The Colpitts RTW oscillator 230 has a structure such that outputs of Colpitts circuit oscillators 240 being at the final stage are crossed and connected to inputs of Colpitts circuit oscillators 240 being at the first stage. The Colpitts circuit oscillators 240 have identical structures. FIG. 27B shows a circuit structure of the Colpitts circuit oscillator 240. The Colpitts circuit oscillator 240 contains an inductor 231, resistors 232 and 233, a capacitor 234, an NMOS transistor 235, a resistor 236, a capacitor 237, an inductor 241, resistors 242 and 243, a capacitor 244, an NMOS transistor 245, a resistor 246, a capacitor 247, and a resistor 250. The Colpitts circuit oscillator 240 is formed to have a structure in which two Colpitts circuits are aligned in parallel.

In the RTW oscillator, an inductance $L_u$ per a unit length of a differential transmission line is given as follows;

$$L_u=(\mu_0/\pi)\text{Log}(\pi s/(\omega+t_c)+1),$$

where s, w and $t_c$ are an interval, a width and a thickness of the differential transmission line, respectively. Also, a phase speed vp is represented as follows;

$$vp=1/(L_u C_f/\text{SegLen})^{1/2},$$

where Cl is a capacitance between the transmission lines, and SegLen is a unit cell length. According to the above formula, an oscillation frequency fc is given as follows;

$$fc=vp/(2 \cdot \text{RingLen}),$$

where RingLen is a circumference. By deleting the circumference RingLen from the above formula, the following formula is obatained;

$$fc=1/(2 \cdot (L_{tot} C_{tot})^{1/2},$$

where $L_{tot}$ is a total inductance including mutual inductances (which is an inductance corresponding to two entire loops because of the double loops) and $C_{tot}$ is a total capacitance between differential transmission lines (which is a quarter of a total stray capacitance corresponding to the two entire loops by considering conversion from a parallel to GND into differential and serial), respectively. By representing the inductors 231 and 241 as Lc, capacitances of the capacitors 234 and 244 as Cf, and capacitances of the capacitors 237 and 247 as Cr in FIG. 27B, the oscillation frequency of the circuit in FIG. 27A is given by the following formula;

$$fc=\tfrac{1}{4}\pi \cdot ((Cf+Cr)/LcCfCr)^{1/2}.$$

In the following, a description will be given of an optical receiver circuit wherein the mixer circuit according to the present invention is applied and the above-mentioned orthogonal (four-phase) oscillator is used.

Figure 28A:
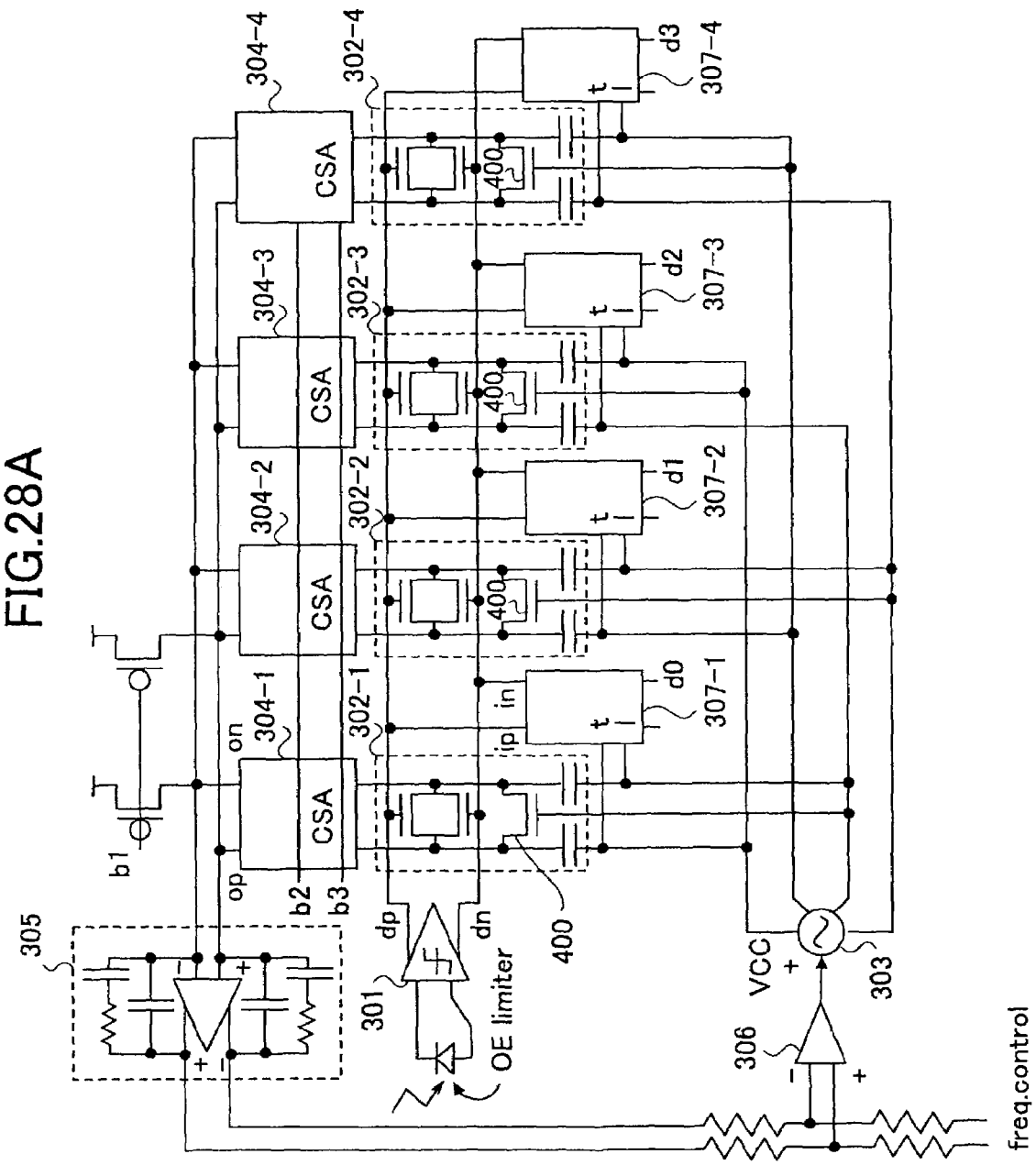

FIG. 28A is a circuit diagram illustrating an optical receiver circuit to which the mixer circuit according to the present invention is applied. An orthogonal (four phase) oscillator shown in FIG. 25 and FIG. 26 is used in the circuit.

The optical receiver circuit in FIG. 28A contains a photoelectric converter OE, a limiter 301, mixer fundamental circuits 302-1 through 302-4, an orthogonal oscillator VCO 303, current sense amplifiers 304-1 through 304-4, a loop filter 305, a differential amplifier 306, and output determination circuits 307-1 through 307-4.

Figure 28D:
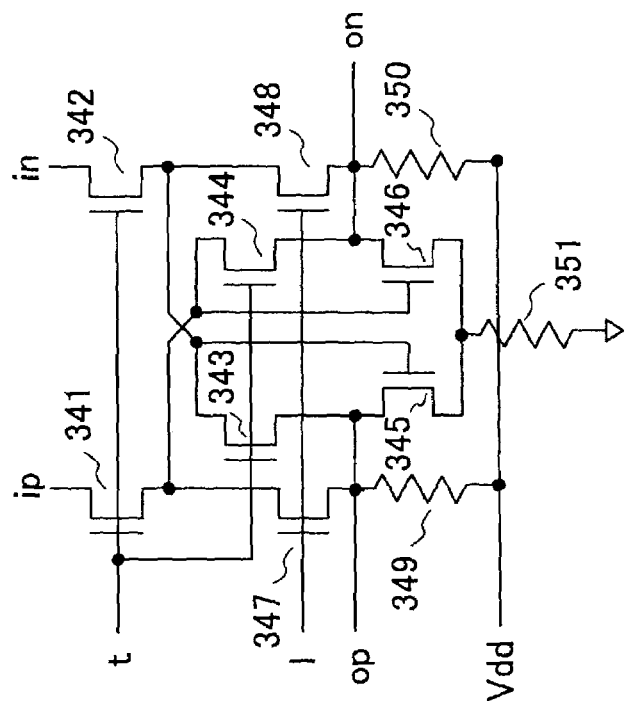
Figure 28C:
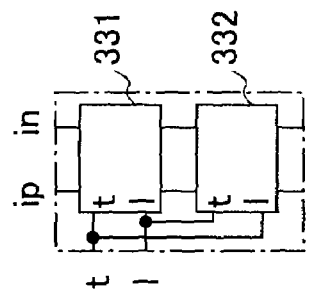
Figure 28B:
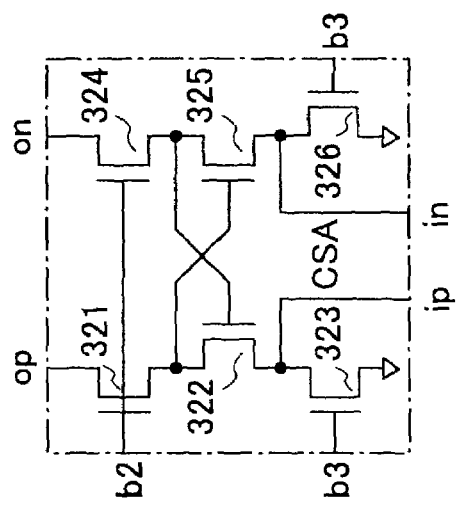

The current sense amplifiers 304-1 through 304-4 have identical circuit structures, and the circuit structure is illustrated in FIG. 28B. The current sense amplifier contains NMOS transistors 321 through 326.

The output determination circuits 307-1 through 307-4 have identical structures, and the circuit structure is illustrated in FIG. 28C. The output determination circuit contains a first high-speed D flip-flop 331 and a second high-speed D flip-flop 332. The high-speed D flip-flops 331 and 332 have identical circuit structures, and the circuit structure is illustrated in FIG. 28D. The high-speed D flip-flop contains NMOS transistors 341 through 348 and resistors 349 through 351. Input signals ip and in are followed while a signal t is HIGH and are latched when a signal l becomes HIGH. The latched signals are output as op and on. Regarding the first high-speed D flip-flop 331, the signals op and on are supplied to the flip-flop 332 being at the next stage. Regarding the second high-speed D flip-flop 332, the signals op and on are outputs of the optical receiver.

In detail, while the signal t is HIGH, the input signals ip and in are read into gate capacitances of the NMOS transistors 345 and 346 and an offset cancel is provided by a negative-feedback via the NMOS transistors 343 and 344. While the signal l is HIGH, the input signals ip and in are discarded and a positive-feedback is provided in the D latch circuit. These operations realize a high-speed read.

In FIG. 28A, an optical input is converted into an electric signal by the photoelectric converter OE, and then is wave-shaped by the limiter 301. The resulting signal is supplied to the mixer fundamental circuits 302-1 through 302-4 according to the present invention. Here, the optical input may be a binary burst signal or a random pattern as long as the optical input satisfies a NRZ (nonreturn-to-zero). The optical input has a fundamental wave component less than half of a clock signal.

In the optical receiver, it is necessary to extract a clock signal from a received signal and retrieve the received signal by using the clock signal. As mentioned above, the mixer circuit according to the present invention makes it possible to detect a phase of a frequency of a carrier signal by using a local signal with half of the carrier frequency. In the structure shown in FIG. 28A, the orthogonal oscillator VCO 303 produces four phase clock signals, and the four mixer circuits 302-1 through 302-4 compare a clock signal in the individual phases with the input signal. At this time, in the individual mixer circuits 302-1 through 302-4, the NMOS transistor 400 short-circuits between signals in sync with a reversed phase clock. As a result, the phase comparison result of only an in-phase clock is provided to the current sense amplifiers 304-1 through 304-4. A voltage output amplified by the current sense amplifier 104 is returned as a feedback to the VCO 303 via the loop filter 305 and the differential amplifier 306. The feedback signal makes it possible to control the transmission of the VCO 303 and form a phase synchronous loop.

Since each of the four mixer circuits supplies the phase comparison results of individual in-phase clocks to the current sense amplifier, it is possible to realize a 4 way-interleaved operation. For example, when a received optical signal has 40 GHz, individual four phase clock signals generated by the VCO 303 have 10 GHz. As a result, it is possible to detect a data signal at 40 GHz by using the output determination circuits 307-1 through 307-4 that operate at 10 GHz.

Loop-controlled clock outputs of the VCO 303 are supplied to the output determination circuits 307-1 through 307-4. As mentioned above, the output determination circuits 307-1 through 307-4 formed with two high-speed D flip-flops maintain received data as their output signals through the latch operation synchronous with the clock.

In the above-mentioned embodiments, when the mixer circuit according to the present invention is used, it is possible to realize an optical receiver having the properties of being small sized, low electric power consuming, high speed and with a low phase noise. Furthermore, when the orthogonal (four-phase) oscillation circuit is used as a VCO formed in a phase synchronous loop, it is possible to receive and detect a high-speed optical signal reliably and easily. As is described with reference to FIG. 13 and FIG. 28, a conventional subharmonic mixer such as APDP may be used to detect a phase of an NRZ/NRZi signal. As a result, it is possible to realize a less electric power consuming and higher-speed optical receiver whose interleave structure is easy.

It is possible to realize a mixer circuit according to the present invention with a small size, low cost and low electric power consumption. In addition, since a signal having half of a frequency to be detected (carrier frequency) is used as the local signal, it is possible to achieve a high gain and a good noise characteristic because a DC offset caused by a local leak signal is not generated and a signal path always has an impedance less than a constant value.

Additionally, when the mixer circuit according to the present invention is used as a phase comparison circuit in a receiver circuit, it is possible to realize a small-sized, low-noise and high-speed phase comparison circuit.

The present invention is not limited to the specifically disclosed embodiments, and variations and modifications may be made without departing from the scope of the present invention.

The present application is based on Japanese priority applications No. 2001-323843 filed Oct. 22, 2001 and No. 2002-158275 filed May 30, 2002, the entire contents of which are hereby incorporated by reference.

What is claimed is:

1. A mixer circuit, comprising:
    a first terminal and a second terminal to which a first differential input signal having a predetermined frequency is applied;
    an active element comprising one or more first switches and one or more second switches, said active element short-circuiting the first terminal and the second terminal intermittently at n times the predetermined frequency by applying a second differential input signal having the n times frequency to the first switches and the second switches for switching between said the first terminal and said second switches alternately, wherein n is an integer greater than 1;
    a gate circuit switching on in a span at least partially including a span in which said active element is not short-circuited; and
    a load circuit having a low input impedance, wherein said first terminal and said second terminal are connected to said load circuit via said gate circuit.

2. The mixer circuit as claimed in claim 1, wherein said active-element is a MOS transistor.

3. The mixer circuit as claimed in claim 1, wherein said active element is a FET.

4. The mixer circuit as claimed in claim 1, wherein said active element is provided with two active elements connected in parallel between said first terminal and said second terminal and said two active elements are driven by mutually reversed signals of said second differential input signal.

5. The mixer circuit as claimed in claim 1, further comprising:
    an inductor; and a load
    a load circuit having a low input impedance, wherein said first terminal and said second terminal are connected to said load circuit via said inductor.

6. The mixer circuit as claimed in claim 1, wherein said n is equal to 2.

7. A frequency comparison circuit, comprising:
    a first phase comparison circuit containing a first active element switching a short-circuit between two terminals to which a first differential input signal is applied, wherein the phase comparison circuit, by driving said first active element by a second differential input signal having a predetermined frequency, intermittently switches on a short-circuit between said terminals at a predetermined multiple frequency of said predetermined frequency;

a second phase comparison circuit containing a second active element switching a short-circuit between two terminals to which a third differential input signal is applied, wherein the phase comparison circuit, by driving said second active element by said second differential input signal having a predetermined frequency, intermittently switches on a short-circuit between said terminals at a predetermined multiple frequency of said predetermined frequency; and a multiplier multiplying a phase comparison result of said first phase comparison circuit and a phase comparison result of said second phase comparison circuit.

8. The frequency comparison circuit as claimed in claim 7, wherein said first differential input signal and said third differential input signal are signals at different times of an identical signal.

9. The frequency comparison circuit as claimed in claim 7, wherein said predetermined multiple frequency is twice of said predetermined frequency.

10. A receiver circuit, comprising:

an n-phase oscillation circuit in which each of n Colpitts circuits and each of n capacities are alternately aligned and said n Colpitts circuits are connected to form a loop via said n capacities;

n phase comparison circuits in which each of n oscillating signals of said n-phase oscillation circuit is set as a first differential input, the n phase comparison circuits containing an active element switching a short-circuit between two terminals to which said first differential input signal is applied, by driving said active element by a second differential input signal having a predetermined frequency, intermittently switching on a short-circuit between said terminals at a predetermined multiple frequency of said predetermined frequency;

a feedback circuit letting said n-phase oscillation circuit generate said n oscillating signals based upon a signal arising between said terminals; and a latch circuit latching said second differential input, signal in sync with each of said n oscillating signals.

* * * * *